(12) United States Patent
Howder et al.

(10) Patent No.: US 10,446,578 B1
(45) Date of Patent: Oct. 15, 2019

(54) METHODS USED IN FORMING AN ARRAY OF ELEVATIONALLY-EXTENDING STRINGS OF MEMORY CELLS, METHODS OF FORMING AN ARRAY OF ELEVATIONALLY-EXTENDING STRINGS OF MEMORY CELLS, AND METHODS OF FORMING AN ARRAY OF VERTICAL STRINGS OF MEMORY CELLS

(71) Applicant: Micron Technology, Inc., Boise, ID (US)

(72) Inventors: Collin Howder, Meridian, ID (US); Justin B. Dorhout, Boise, ID (US); Anish A. Khandekar, Boise, ID (US); Mark W. Kiehlbauch, Boise, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/111,584

(22) Filed: Aug. 24, 2018

(51) Int. Cl.
*H01L 27/11582* (2017.01)
*H01L 27/11521* (2017.01)
(Continued)

(52) U.S. Cl.
CPC .. *H01L 27/11582* (2013.01); *H01L 21/02532* (2013.01); *H01L 21/02645* (2013.01);
(Continued)

(58) Field of Classification Search
CPC ......... H01L 27/11582; H01L 21/28273; H01L 21/02532; H01L 21/28282;
(Continued)

(56) References Cited

U.S. PATENT DOCUMENTS 9,263,459 B1 2/2016 Li et al.
9,362,300 B2 6/2016 Lu et al.
(Continued)

OTHER PUBLICATIONS

U.S. Appl. No. 16/111,648, filed Aug. 24, 2018, by Howder et al.

*Primary Examiner* — Yasser A Abdelaziez
(74) *Attorney, Agent, or Firm* — Wells St. John P.S.

(57) ABSTRACT

A method used in forming an array of elevationally-extending strings of memory cells comprises forming a lower stack comprising vertically-alternating insulative tiers and wordline tiers. Lower channel openings are in the lower stack. A bridge is epitaxially grown that covers individual of the lower channel openings. A lower void space is beneath individual of the bridges in the individual lower channel openings. An upper stack is formed above the lower stack. The upper stack comprises vertically-alternating insulative tiers and wordline tiers. Upper channel openings are formed into the upper stack to the individual bridges to form interconnected channel openings individually comprising one of the individual lower channel openings and individual of the upper channel openings. The interconnected channel openings individually have one of the individual bridges there-across. The individual bridges are penetrated through to uncover individual of the lower void spaces. Transistor channel material is formed in an upper portion of the interconnected channel openings elevationally along the vertically-alternating tiers in the upper stack.

27 Claims, 28 Drawing Sheets

(51) Int. Cl.
*H01L 27/11556* (2017.01)
*H01L 21/02* (2006.01)
*H01L 27/11568* (2017.01)
*H01L 21/28* (2006.01)

(52) U.S. Cl.
CPC .. *H01L 21/28273* (2013.01); *H01L 21/28282* (2013.01); *H01L 27/11521* (2013.01); *H01L 27/11556* (2013.01); *H01L 27/11568* (2013.01)

(58) Field of Classification Search
CPC ......... H01L 21/02645; H01L 27/11556; H01L 27/11521; H01L 27/11568
See application file for complete search history.

(56) References Cited

U.S. PATENT DOCUMENTS

| | | |
|---|---|---|
| 9,570,463 B1* | 2/2017 | Zhang ............... H01L 29/66666 |
| 2008/0188051 A1 | 8/2008 | Wells |
| 2013/0277731 A1 | 10/2013 | Goda et al. |
| 2014/0264525 A1 | 9/2014 | Takahashi et al. |
| 2017/0110543 A1* | 4/2017 | Shin ..................... H01L 21/764 |
| 2017/0154892 A1* | 6/2017 | Oh ..................... H01L 27/11556 |
| 2018/0040626 A1 | 2/2018 | Zhu et al. |

* cited by examiner

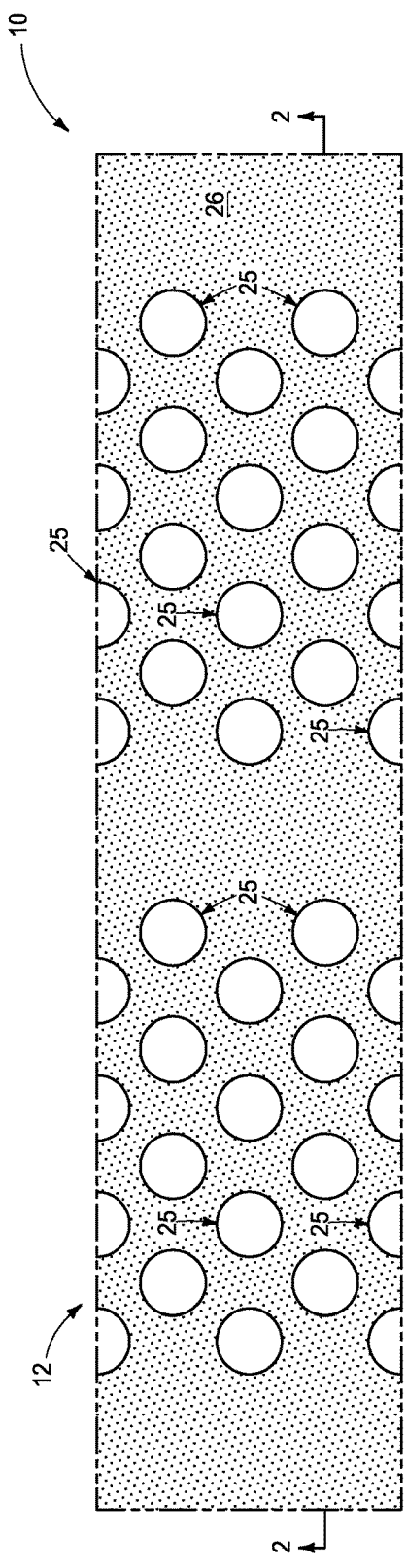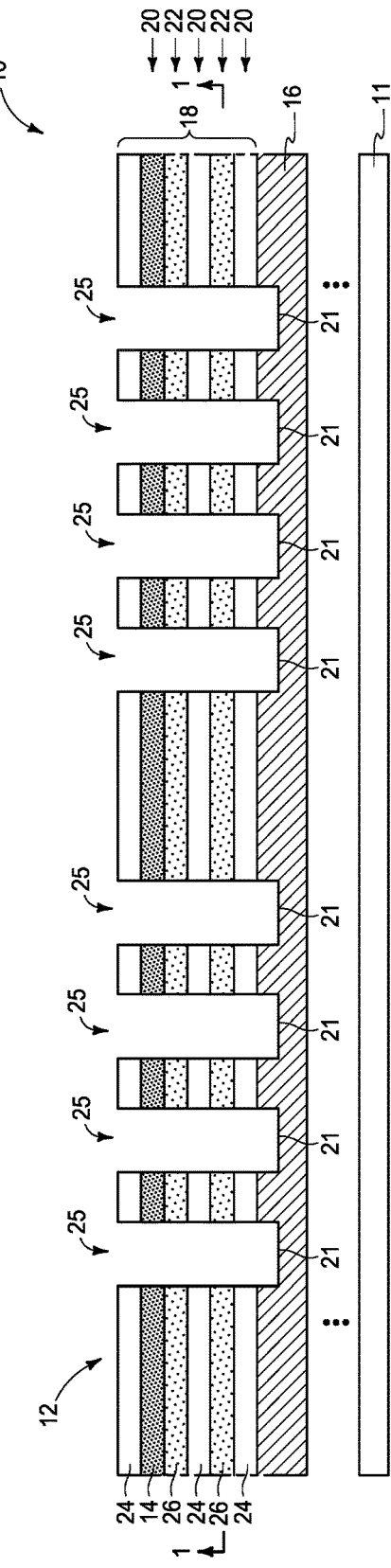

METHODS USED IN FORMING AN ARRAY OF ELEVATIONALLY-EXTENDING STRINGS OF MEMORY CELLS, METHODS OF FORMING AN ARRAY OF ELEVATIONALLY-EXTENDING STRINGS OF MEMORY CELLS, AND METHODS OF FORMING AN ARRAY OF VERTICAL STRINGS OF MEMORY CELLS

TECHNICAL FIELD

Embodiments disclosed herein pertain to methods used in forming an array of elevationally-extending strings of memory cells, to methods of forming an array of elevationally-extending strings of memory cells, and to methods of forming an array of vertical strings of memory cells.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a view taken through line 2-2 in FIG. 1.

DETAILED DESCRIPTION OF EXAMPLE EMBODIMENTS

Figure 3:
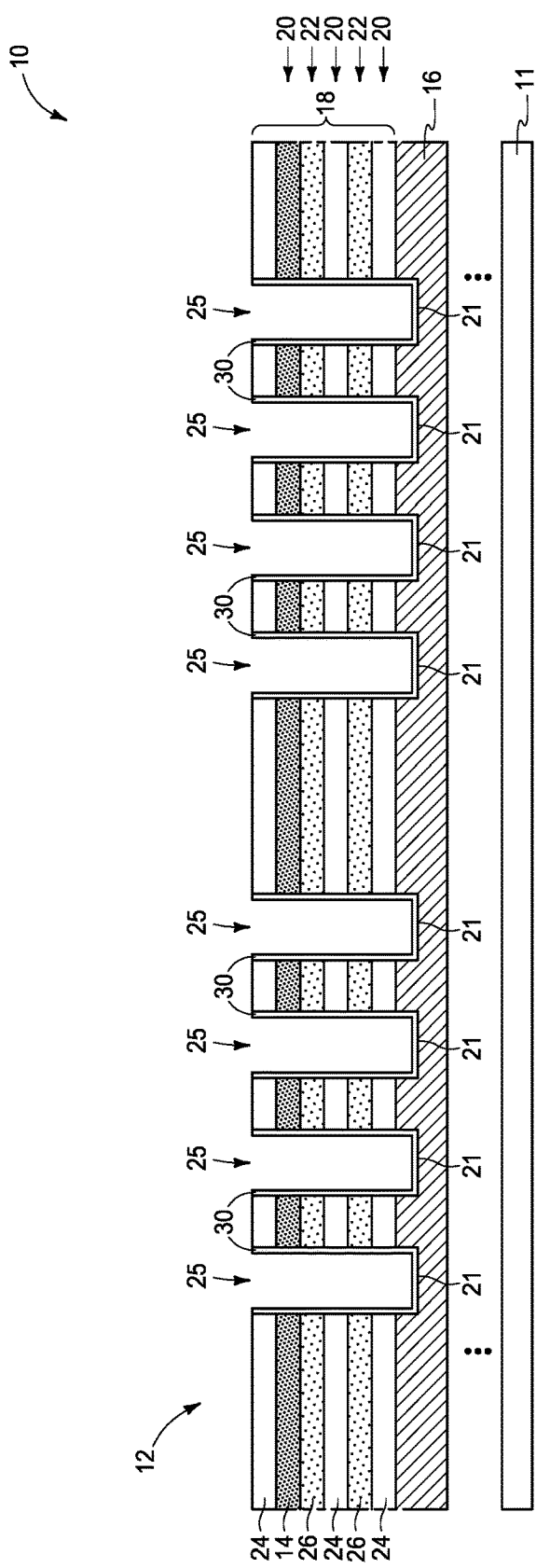
FIG. 3 is a view of the FIG. 2 substrate at a processing step subsequent to that shown by FIG. 2.

Embodiments of the invention encompass methods of forming an array of elevationally-extending strings of transistors and/or memory cells, for example an array of NAND or other memory cells having peripheral control circuitry under the array (e.g., CMOS under-array). Embodiments of the invention encompass so-called "gate-last" or "replacement-gate" processing, so-called "gate-first" processing, and other processing whether existing or future-developed independent of when transistor gates are formed. First example embodiments are described with reference to FIGS. 1-26 which may be considered as a "gate-last" or "replacement-gate" process.

FIGS. 1 and 2 show a substrate construction 10 in process of a method of forming an array 12 of elevationally-extending strings of transistors and/or memory cells. Substrate construction 10 comprises a base substrate 11 having any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Substrate construction 10 comprises a lower stack 18 comprising vertically-alternating insulative tiers 20 and wordline tiers 22 directly above an example conductively-doped semiconductor material 16 (e.g., conductively-doped polysilicon). Conductive material 16 may comprise a part of control circuitry (e.g., peripheral-under-array circuitry) used to control read and write access to the transistors and/or memory cells that will be formed within array 12. Lower-stack insulative tiers 20 comprise insulative lower-stack first material 24 (e.g., silicon dioxide). Lower-stack wordline tiers 22 comprise lower-stack second material 26 that is of different composition from that of lower-stack first material 24 (e.g., silicon nitride, and regardless which may be wholly or partially sacrificial). In one embodiment, lower stack 18 comprises a seed material 14 that may be one of tiers 20 or 22 (e.g., being a tier 20 as shown) and that may be wholly or partially sacrificial. Seed material 14 will provide a surface or surfaces from which epitaxial growth will occur as described below. Lower channel openings 25 have been formed (e.g., by dry anisotropic etching) into alternating tiers 20, 22, with example seed material 14 (and materials 24 and 26) surrounding individual lower channel openings 25. In one embodiment, lower channel openings 25 have individual bases 21 within material 16.

By way of example only, lower channel openings 25 are shown as being arranged in groups or columns of staggered rows of four openings 25 per row. Any alternate existing or future-developed arrangement and construction may be used. Use of "row" and "column" in this document is for convenience in distinguishing one series or orientation of features from another series or orientation of features and along which components have been or may be formed. "Row" and column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles. Other circuitry that may or may not be part of peripheral circuitry may be between conductively-doped semiconductor material 16 and stack 18.

Referring to FIG. 3, lower-stack memory cell material 30 has been formed within lower channel openings 25 laterally across individual bases 21 and along sidewalls of lower channel openings 25. In the context of this document, "memory cell material" is any material that comprises operative material in a finished memory cell construction including, by way of examples only, any one or more of gate material, source/drain material, charge-blocking material, charge-storage material, charge-passage material, gate dielectric, and channel material. In one embodiment, memory cell material 30 comprises at least one of (a) lower-stack charge-blocking material or (b) lower-stack charge-storage material (e.g., floating gate material such as doped or undoped silicon or charge-trapping material such as silicon nitride, metal dots, etc.). In one such embodiment, the memory cell material comprises (a). In one such embodiment, the memory cell material comprises (b). In one such embodiment, the memory cell material comprises (a) and (b). Memory cell material 30 may be formed by, for example, deposition of a thin layer thereof over lower stack 18 and within individual lower channel openings 25 followed by planarizing such back at least to an elevationally-outermost surface of stack 18.

Figure 4:
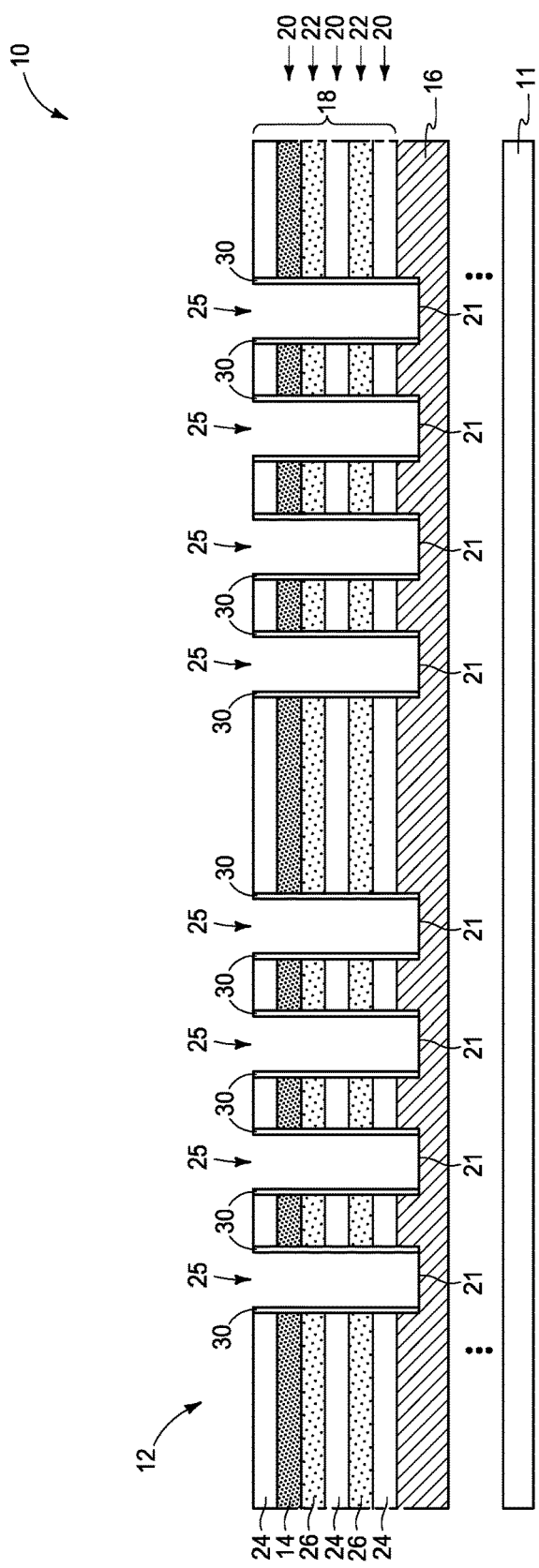
FIG. 4 is a view of the FIG. 3 substrate at a processing step subsequent to that shown by FIG. 3.

Referring to FIG. 4, a portion (e.g, a laterally-central portion and/or a radially-central portion) of lower-stack memory cell material 30 that is laterally across individual bases 21 in individual lower channel openings 25 has been removed. By way of example, such may occur by maskless anisotropic etching of material 30 using one or more etching chemistries, and which may be conducted in lieu of first removing such material from being over horizontal surfaces atop lower stack 18 as shown in FIG. 3.

Figure 5:
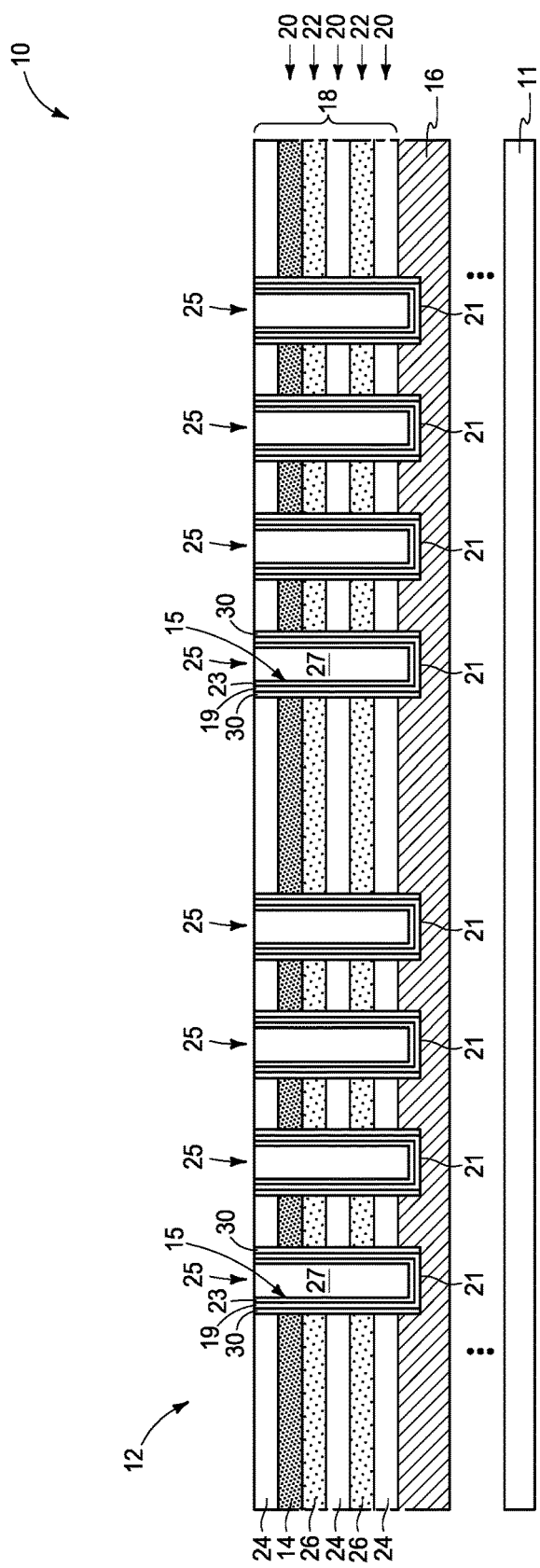
FIG. 5 is a view of the FIG. 4 substrate at a processing step subsequent to that shown by FIG. 4.

Referring to FIG. 5, and in one embodiment, a sacrificial liner 15 has been formed along individual bases 21 and along sidewalls of individual lower channel openings 25 after removing the portion of lower-stack memory cell material 30. In one embodiment and as shown, sacrificial liner 15 less-than-fills individual lower channel openings 25 and the method further comprises plugging all remaining volume of individual lower channel openings 25 with sacrificial fill material 27 (e.g., aluminum oxide and/or photoresist) after forming sacrificial liner 15. In one embodiment, sacrificial liner 15 comprises polysilicon 19 and in one such embodiment comprises silicon dioxide 23 radially inward of polysilicon 19.

Figure 6:
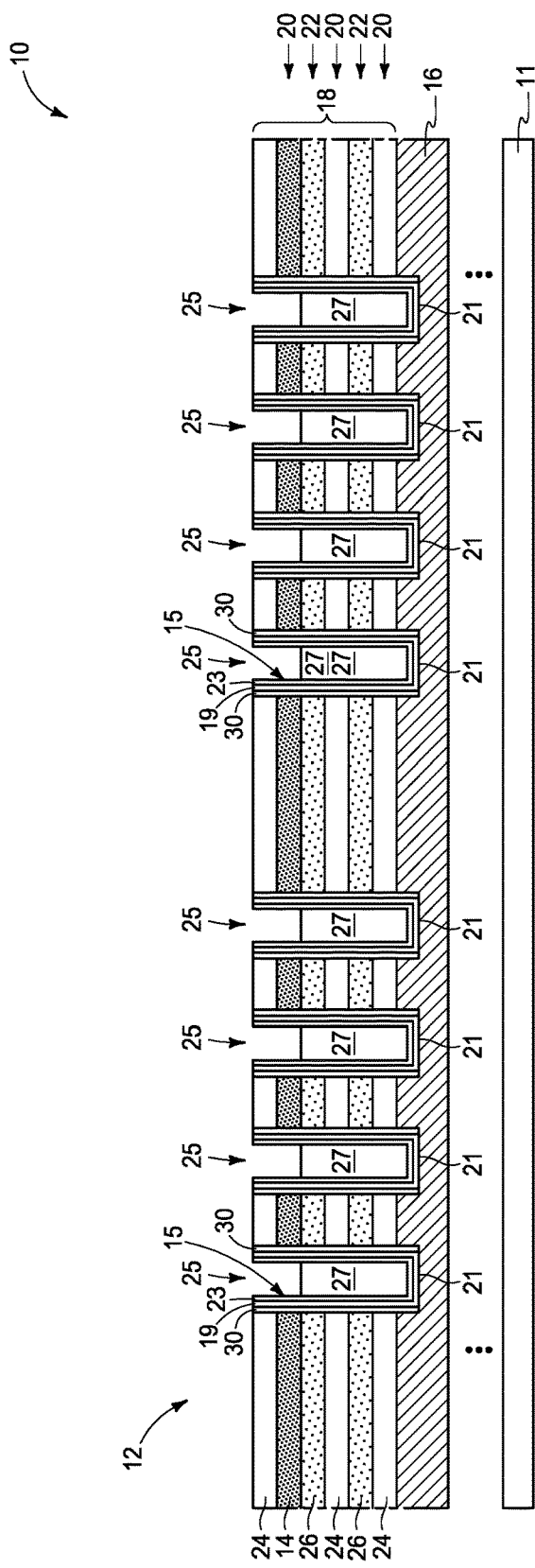
FIG. 6 is a view of the FIG. 5 substrate at a processing step subsequent to that shown by FIG. 5.
Figure 7:
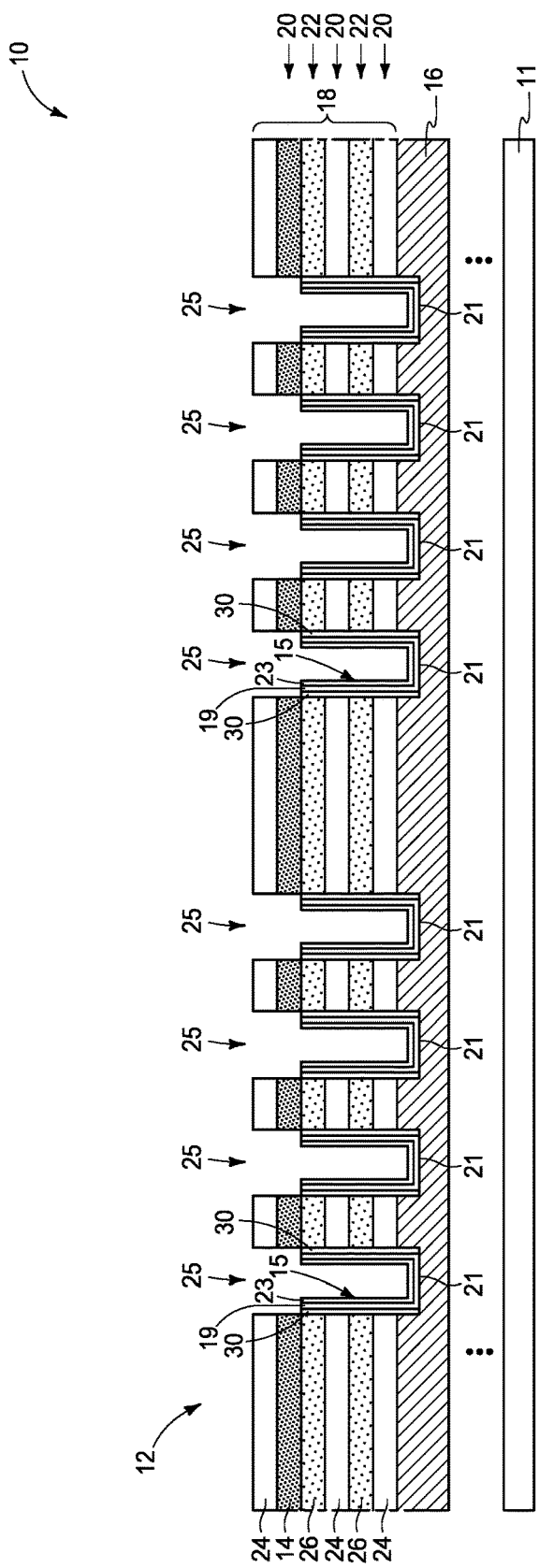
FIG. 7 is a view of the FIG. 6 substrate at a processing step subsequent to that shown by FIG. 6.

The memory cell material, the sacrificial liner, and the sacrificial fill material are elevationally recessed to below (i.e., to at least below) a top surface of seed material 14. FIG. 6 shows one example embodiment wherein sacrificial fill material 27 is recessed elevationally inward to (i.e., at least to) a bottom surface of seed material 14. Thereafter, and referring to FIG. 7, unmasked portions of sacrificial liner 15 and memory cell material 30 have been recessed to below a top surface of seed material 14 and sacrificial fill material 27 (not shown) has then been removed. As an alternate example, sacrificial liner 15 may not be used (not shown) and with sacrificial fill material 27 alone being used to mask lower portions of memory cell material 30 from being removed. A reason for using sacrificial liner 15 is described below.

Figure 8:
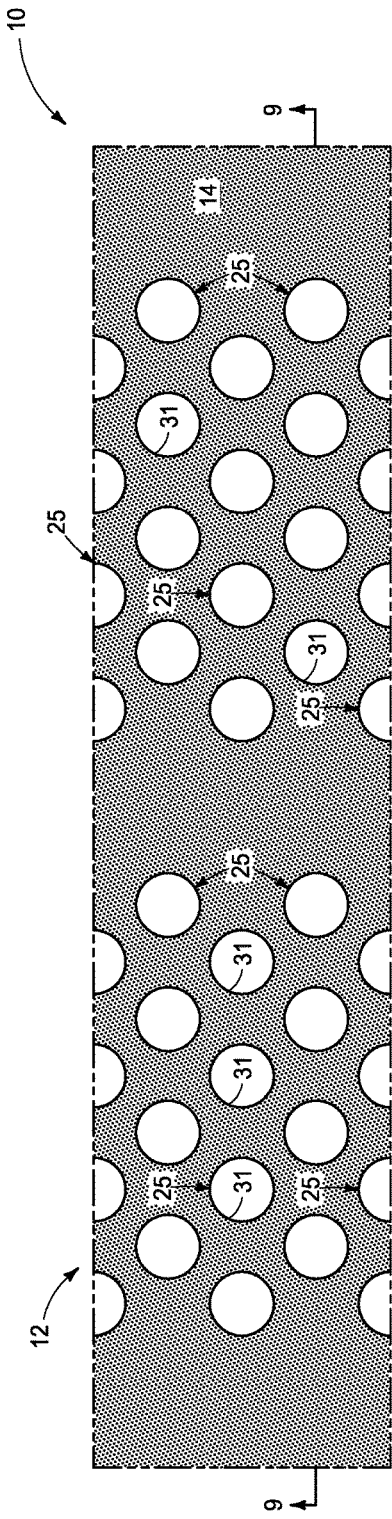
FIG. 8 is a view of the FIG. 7 substrate at a processing step subsequent to that shown by FIG. 7 and is taken through line 8-8 in FIG. 9.
Figure 9:
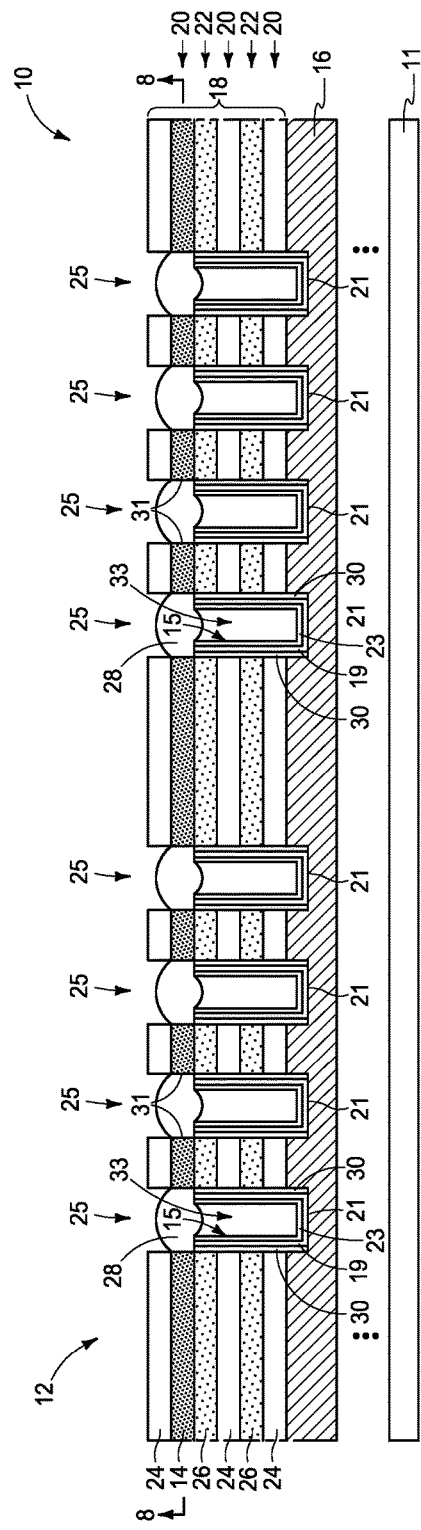
FIG. 9 is a view taken through line 9-9 in FIG. 8.

Referring to FIGS. 8 and 9, a bridge 28 has been epitaxially grown to cover individual lower channel openings 25. Such forms a lower void space 33 beneath individual bridges 28 in individual lower channel openings 25. Bridge 28 may extend upwardly and/or downwardly (both being shown) relative to seed material 14. In one embodiment, the epitaxial growing comprises heteroepitaxy. In one embodiment, bridge 28 comprises elemental-form silicon (e.g., which can be epitaxially grown from a monocrystalline or polycrystalline silicon seed material 14 or from a silicon nitride seed material 14). In one embodiment, bridge 28 comprises SiGe (e.g., which can also be epitaxially grown from a monocrystalline or polycrystalline silicon seed material 14 or from a silicon nitride seed material 14). In one embodiment and as shown, the epitaxial growing is conducted selectively from a sidewall surface 31 of seed material 14 that surrounds individual lower channel openings 25. In one such embodiment and as shown, masking material (e.g., material 24 of the uppermost tier in stack 18) is atop seed material 14 during the epitaxial growing, for example such that the epitaxial growing of material of bridge 28 does not occur from the top surface of seed material 14. Alternately and by way of example only, the epitaxial growing may be conducted from both sidewall surface 31 and from the top surface (not shown) of seed material 14. Regardless and in one embodiment, the epitaxial growing of material of bridge 28 may be conducted from sidewall surface 31 of seed material 14 while sidewalls of individual lower channel openings 25 below seed material 14 are masked (e.g., by lining 15 as shown) during such epitaxial growing. In one such embodiment, lining 15 may be considered as mask material which was initially formed over all of sidewall surface 31 of seed material 14 within individual lower channel openings 25 (and across bases 21), and which was elevationally recessed to below the top surface of seed material 14, and in one embodiment downwardly at least to the bottom surface of seed material 14, prior to the epitaxial growing. Sacrificial lining 15 may be used ideally to prevent epitaxial growth from bases 21 when exposed material thereof (e.g., material 16) may also seed epitaxial growth. However, epitaxial growth may occur from bases 21 (not shown) regardless of whether such epitaxially grown material is subsequently removed.

Figure 10:
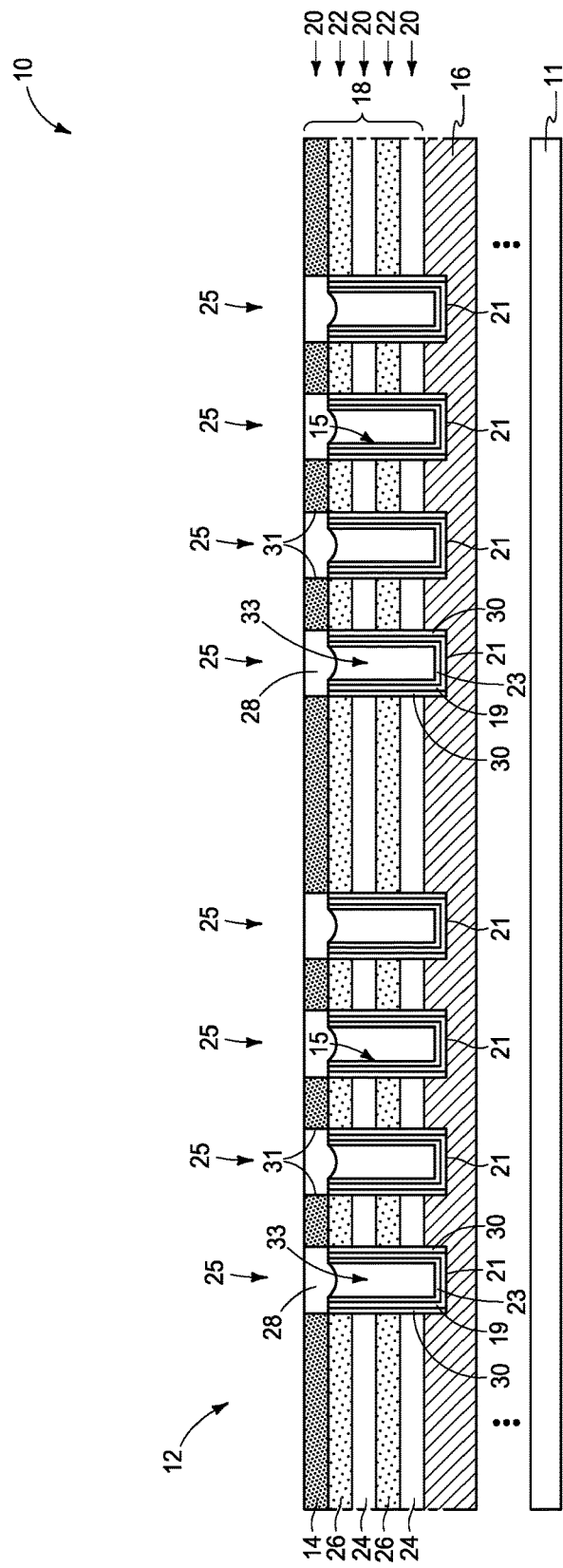
FIG. 10 is a view of the FIG. 9 substrate at a processing step subsequent to that shown by FIG. 9.

Referring to FIG. 10, and in one embodiment, all of the masking material (e.g., all of material 24 in the uppermost tier of stack 18 in FIG. 9, and which is thereby not shown in FIG. 10) has been removed (e.g., by etching and/or polishing).

Figure 11:
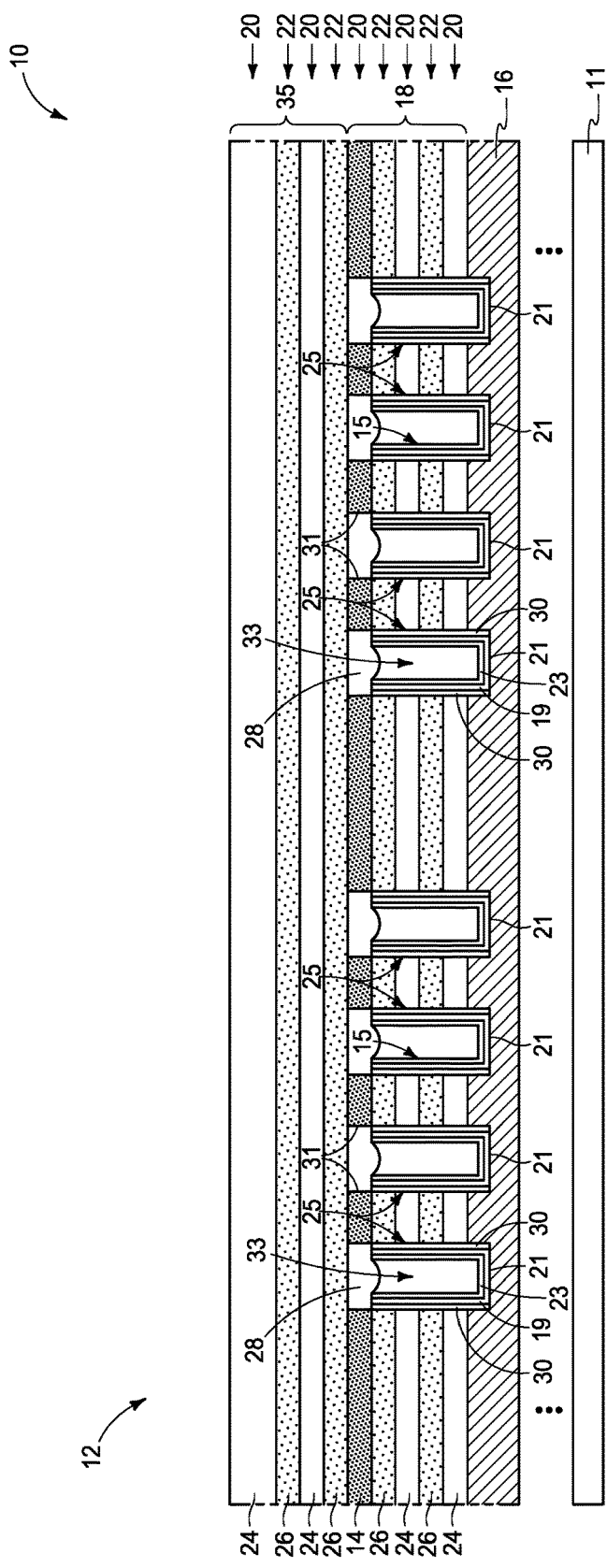
FIG. 11 is a view of the FIG. 10 substrate at a processing step subsequent to that shown by FIG. 10.

Referring to FIG. 11, an upper stack 35 has been formed above lower stack 18. Upper stack 35 comprises vertical-alternating insulative tiers 20 and wordline tiers 22. In one embodiment, upper-stack insulative tiers 24 comprise insulative upper-stack first material 24 (that may be of the same or different composition from lower-stack first material 24) and upper-stack wordline tiers 22 comprise upper-stack second material 26 (that may be of the same or different composition from that of lower-stack second material 26) that is of different composition from that of upper-stack first material 24. Only a few tiers 20, 22 in each of the upper and lower stacks are shown although likely many more (e.g., dozens, hundreds, etc.) would be in each stack, and the stacks need not have the same number of tiers relative one another.

Figure 12:
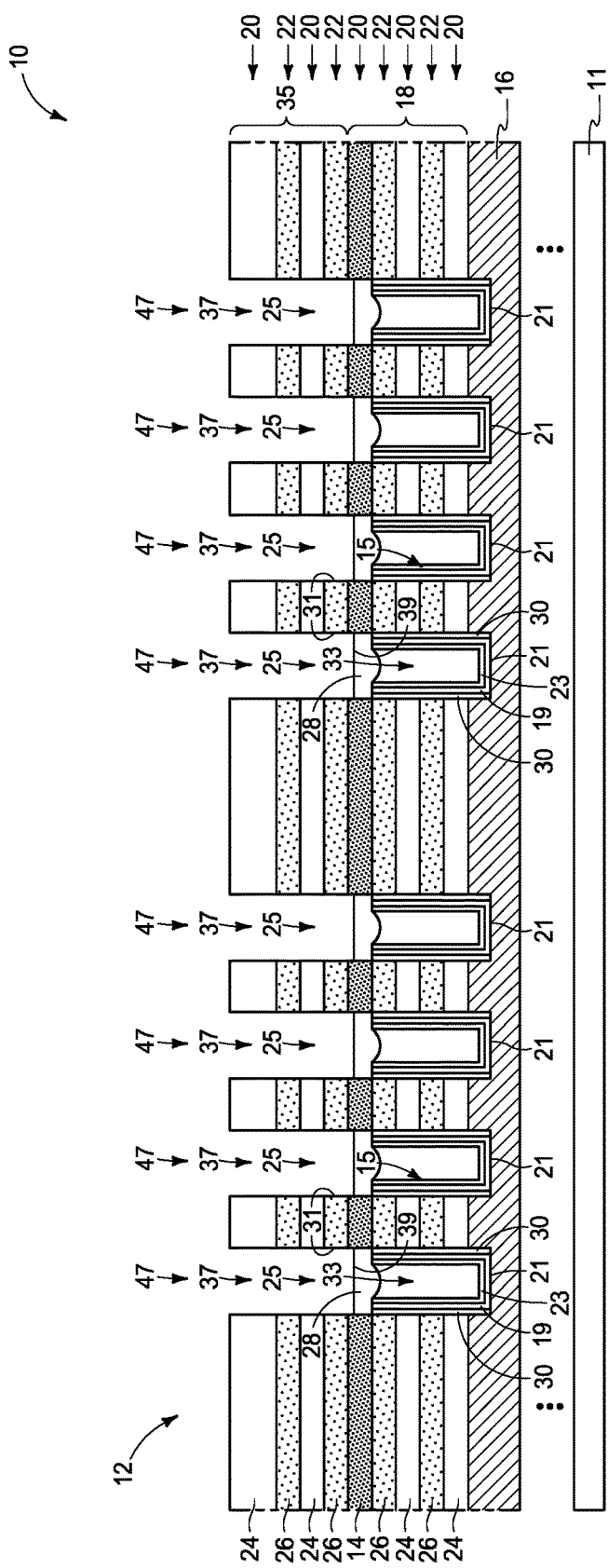
FIG. 12 is a view of the FIG. 11 substrate at a processing step subsequent to that shown by FIG. 11.

Referring to FIG. 12, upper channel openings 37 have been formed (e.g., by dry anisotropic etching) into upper stack 35 to individual bridges 28 to form interconnected channel openings 47 individually comprising one of individual lower channel openings 25 and individual of upper channel openings 37 and having individual bridges 28 there-across. Upper channel openings 37 may be considered as compromising individual bases 39. Formation of upper channel openings 37 may elevationally recess bridges 28 as shown.

Figure 13:
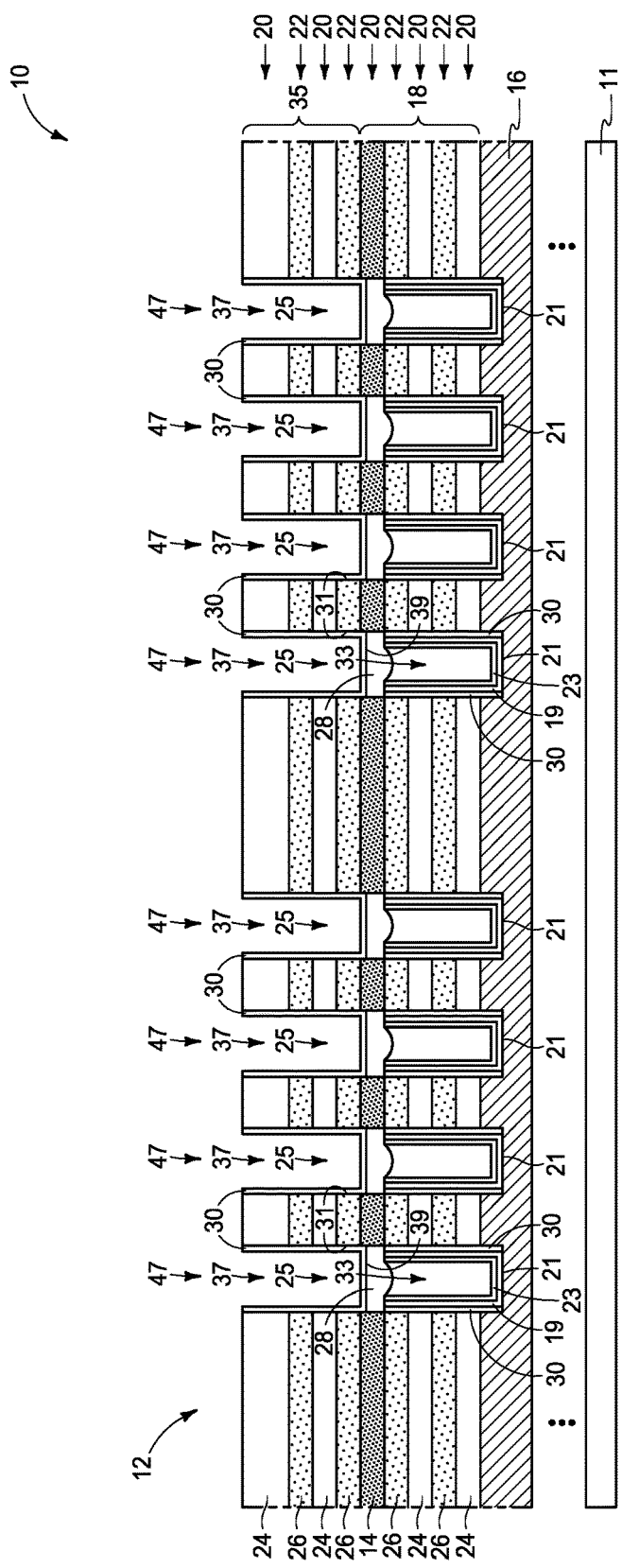
FIG. 13 is a view of the FIG. 12 substrate at a processing step subsequent to that shown by FIG. 12.

Referring to FIG. 13, and in one embodiment, upper-stack memory cell material 30 has been formed across individual bases 39 of individual upper channel openings 37. Upper-stack memory cell material 30 may be of the same or different composition(s) as lower-stack memory cell material 30. Regardless, in one embodiment, upper-stack memory cell material 30 comprises at least one of (c) upper-stack charge-blocking material or (d) upper-stack charge-storage material (e.g., floating gate material such as doped or undoped silicon or charge-trapping material such as silicon nitride, metal dots, etc.). In one such embodiment, the memory cell material comprises (c). In one such embodiment, the memory cell material comprises (d). In one such embodiment, the memory cell material comprises (c) and (d). Upper-stack memory cell material 30 may be formed by, for example, deposition of a thin layer thereof over upper stack 35 and within individual upper channel openings 37 followed by planarizing such back at least to an elevationally-outermost surface of stack 35.

Figure 14:
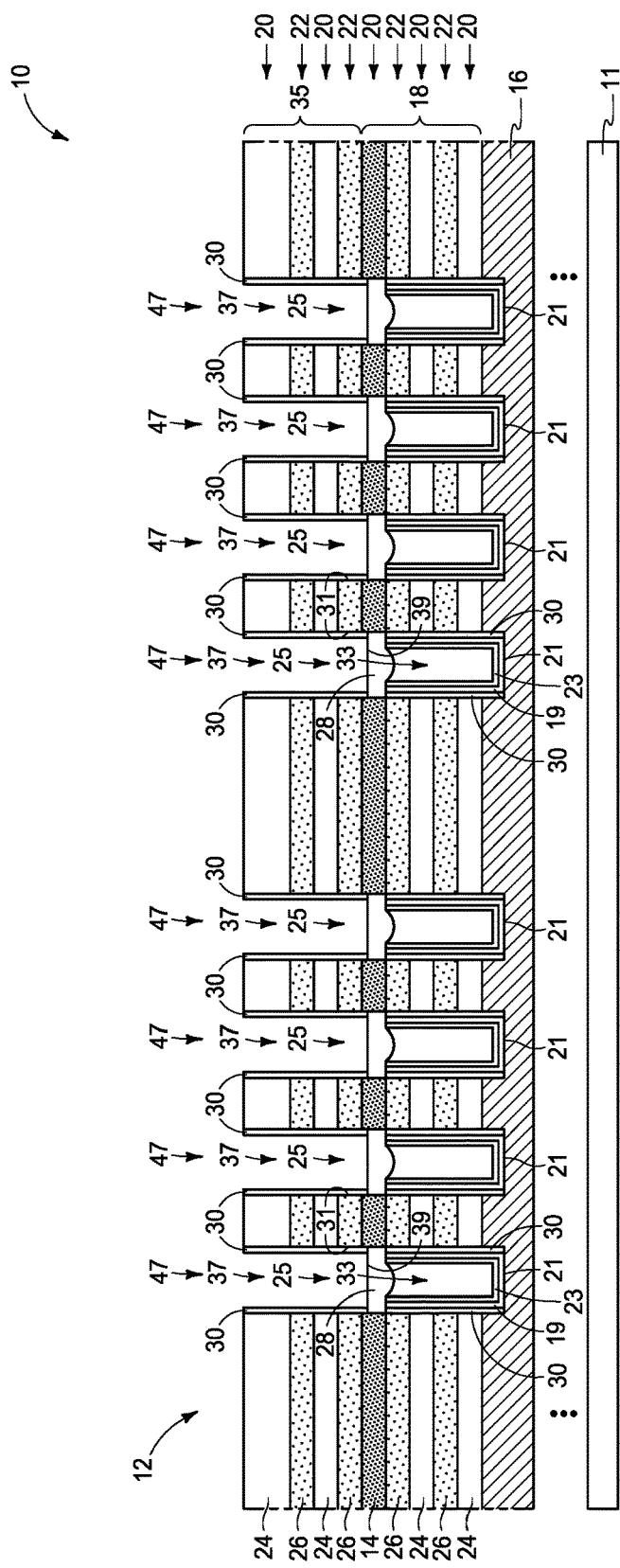
FIG. 14 is a view of the FIG. 13 substrate at a processing step subsequent to that shown by FIG. 13.

Referring to FIG. 14, a portion of upper-stack memory cell material 30 that is laterally across individual bases 39 in individual upper channel openings 37 has been removed (e.g., by maskless anisotropic etching).

Figure 15:
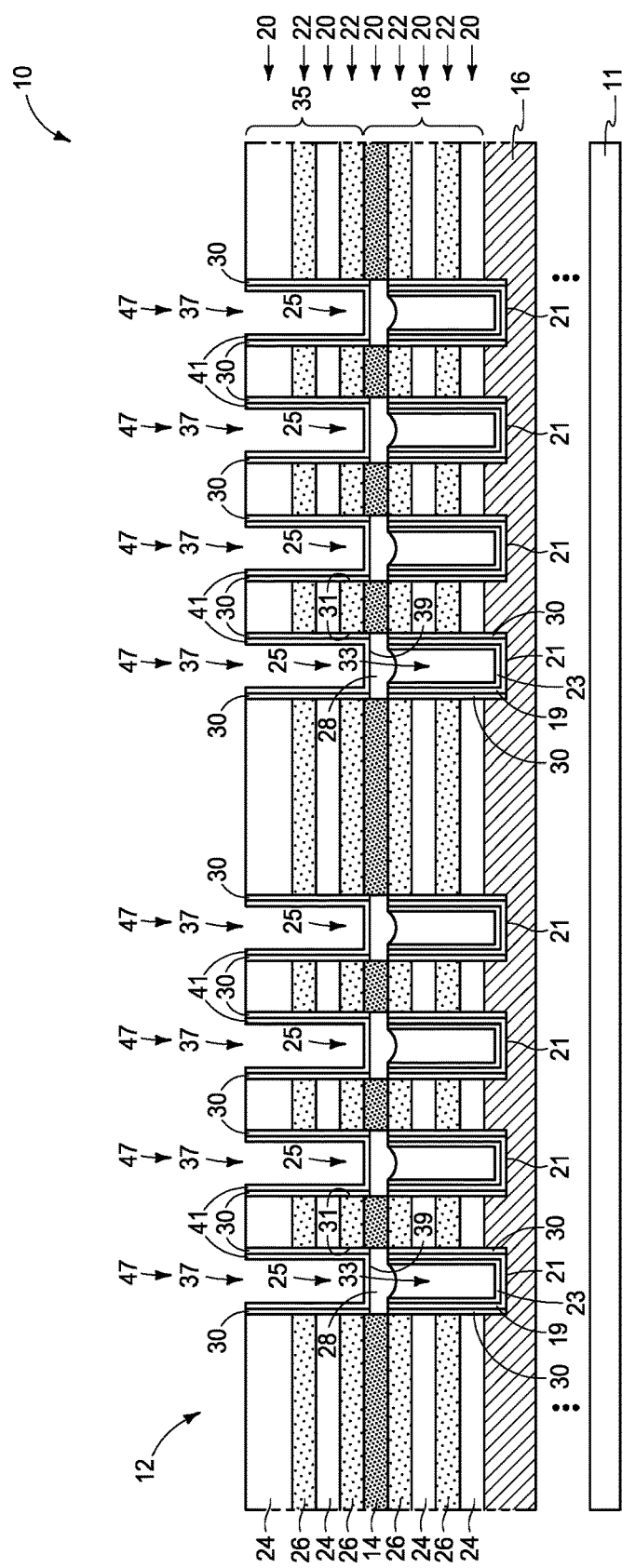
FIG. 15 is a view of the FIG. 14 substrate at a processing step subsequent to that shown by FIG. 14.

Referring to FIG. 15, and in one embodiment, a sacrificial liner 41 (e.g., polysilicon) that less-than-fills individual upper channel openings 37 has been formed in upper channel openings 37.

Figure 16:
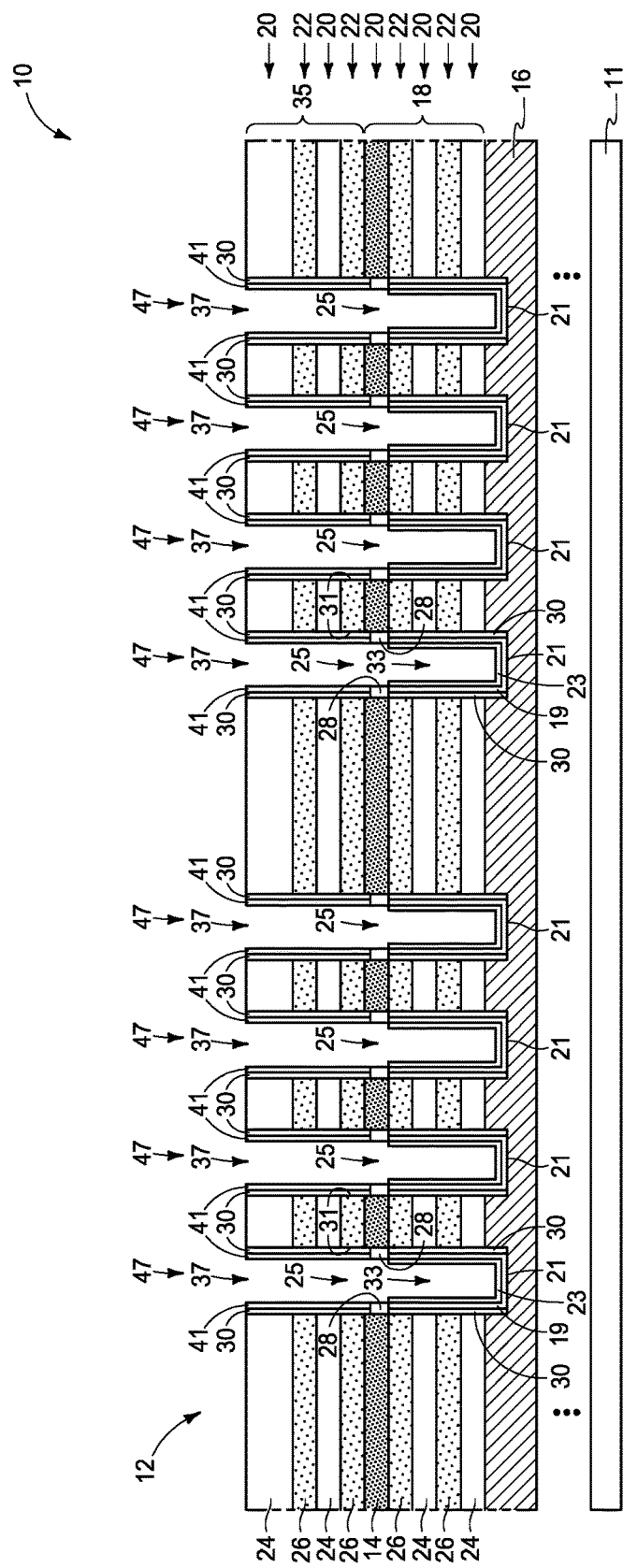
FIG. 16 is a view of the FIG. 15 substrate at a processing step subsequent to that shown by FIG. 15.

Referring to FIG. 16, individual bridges 28 (and sacrificial liner 41 when present) has been penetrated through to uncover individual lower void spaces 33. Such may be conducted, by way of example, by wet or dry selective anisotropic or isotropic etching (e.g., using tetramethyl ammonium hydroxide and/or an ammonium peroxide).

Figure 17:
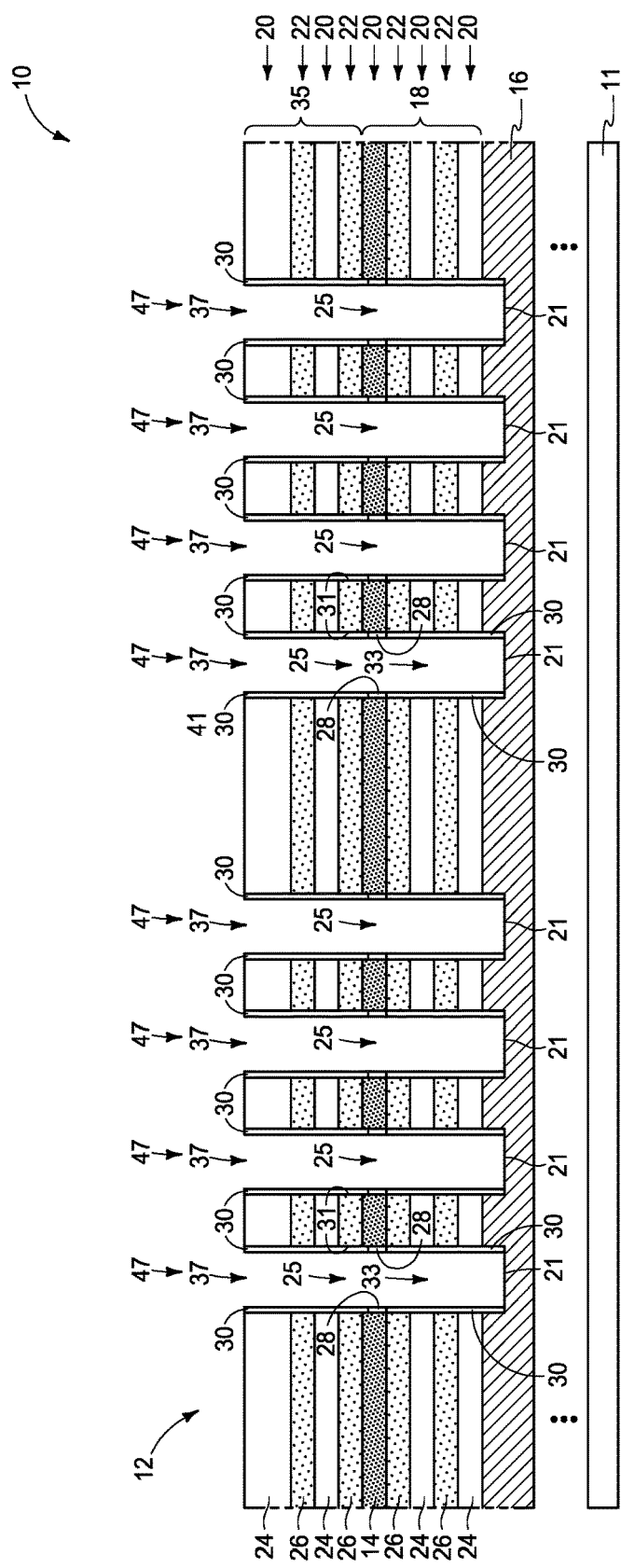
FIG. 17 is a view of the FIG. 16 substrate at a processing step subsequent to that shown by FIG. 16.

Referring to FIG. 17, all of sacrificial liners 15 and 41 (neither being shown) have been removed after penetrating through bridges 28 (e.g., by selective anisotropic etching).

Figure 18:
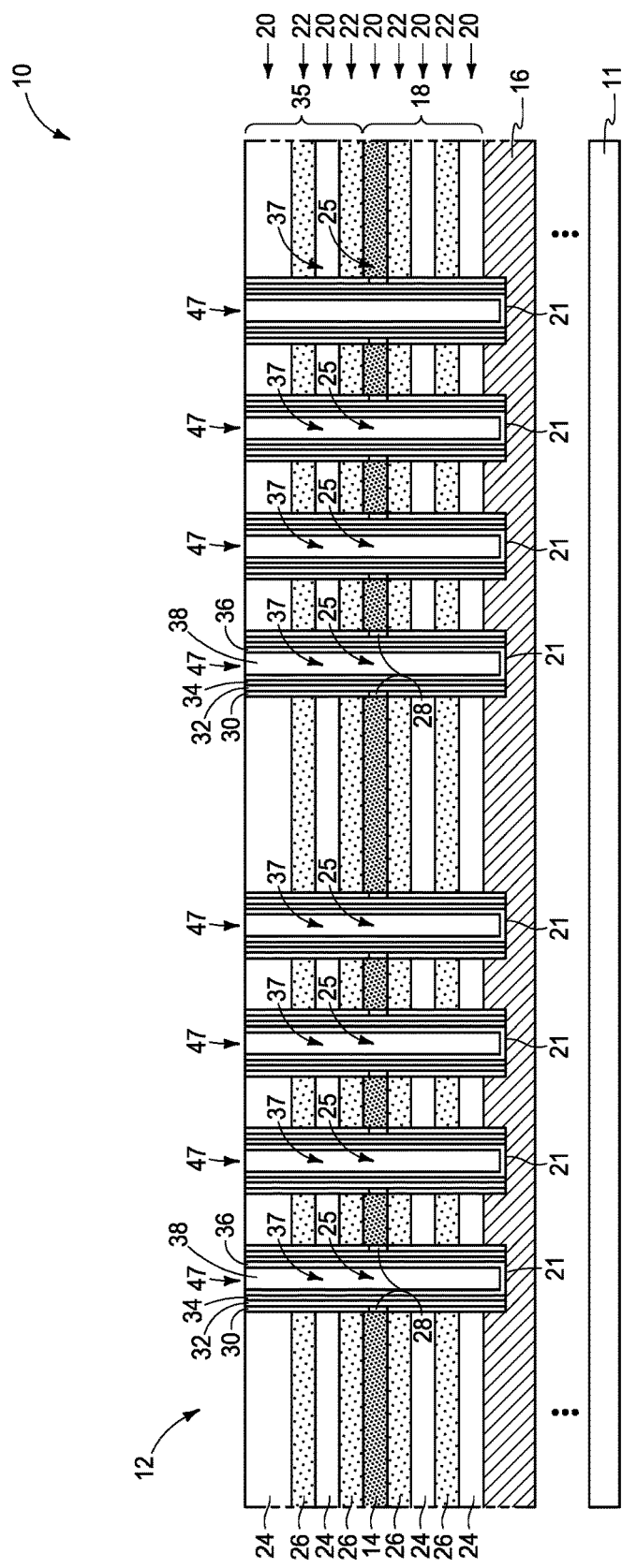
FIG. 18 is a view of the FIG. 17 substrate at a processing step subsequent to that shown by FIG. 17.

Referring to FIG. 18, and where for example memory cell material 30 comprises charge-blocking material, charge-storage material 32 has been formed in interconnected channel openings 47 elevationally along alternating tiers 20, 22 and charge-blocking material 30. Insulative charge-passage material 34 has been formed in interconnected channel openings 47 along alternating tiers 20, 22 and charge-storage material 32. Charge-passage material 34 may be, by way of example, a bandgap-engineered structure having nitrogen containing material (e.g., silicon nitride) sandwiched between two insulator oxides (e.g., silicon dioxide).

Transistor channel material 36 has been formed in an upper portion (i.e., at least) of interconnected channel openings 47 elevationally along vertically-alternating tier 20, 22 in upper stack 35 (i.e., at least). In one embodiment and as shown, transistor channel material 36 has been formed concurrently in both upper channel openings 37 and lower channel openings 25 of interconnected channel openings 47. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 are 25 to 100 Angstroms. Interconnected channel openings 47 are shown as comprising a radially-central solid dielectric material 38 (e.g., spin-on-dielectric, silicon dioxide, and/or silicon nitride). Alternately, and by way of example only, the radially-central portion within interconnected channel openings 47 may include void space(s) (not shown) and/or be devoid of solid material (not shown).

Figure 19:
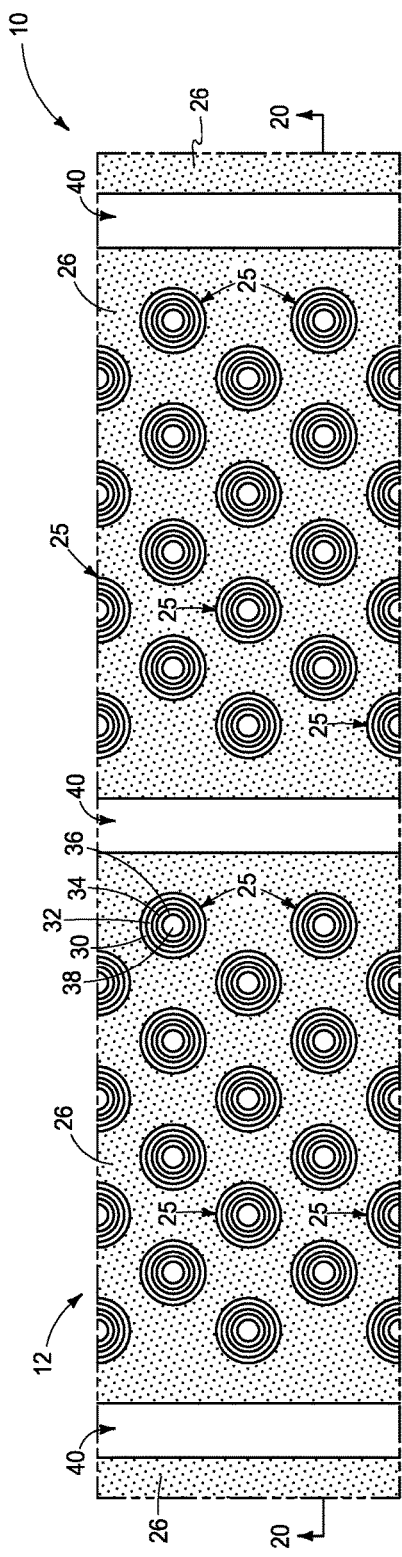
FIG. 19 is a view of the FIG. 18 substrate at a processing step subsequent to that shown by FIG. 18 and is taken through line 19-19 in FIG. 20.
Figure 20:
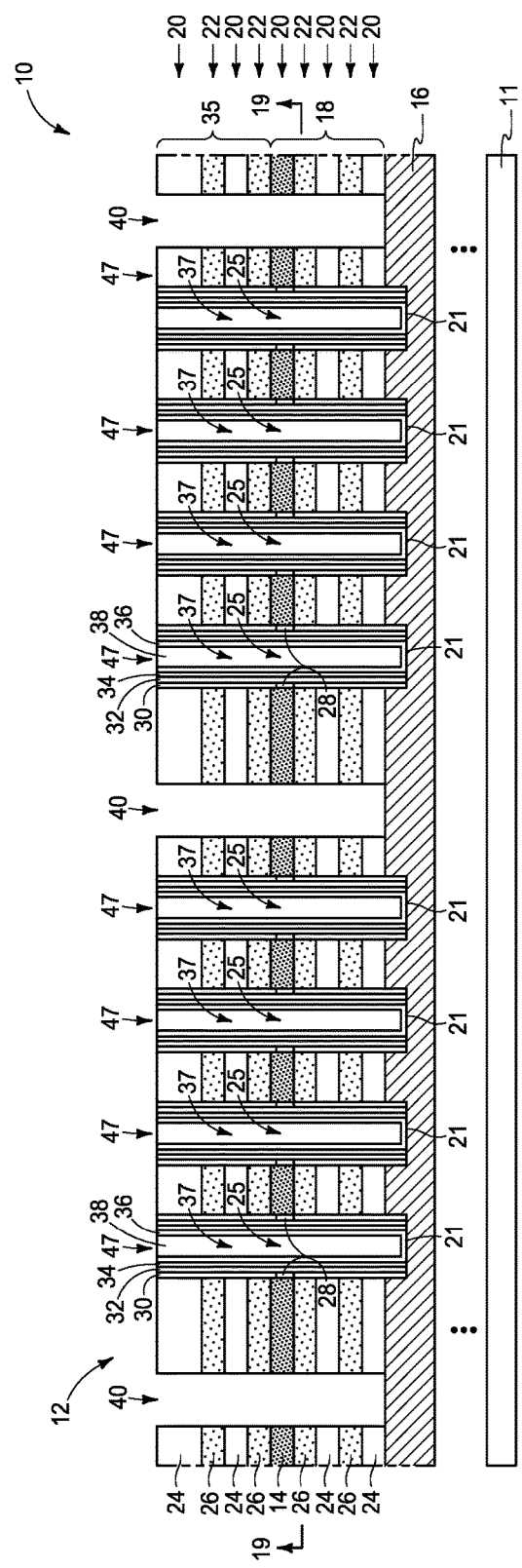
FIG. 20 is a view taken through line 20-20 in FIG. 19.

Referring to FIGS. 19 and 20, horizontally-elongated (FIG. 19) trenches 40 have been formed (e.g., by anisotropic etching) into upper stack 35 and lower stack 18 and in one embodiment to conductively-doped semiconductor material 16 (i.e., at least to material 16). Lateral edges of trenches 40 may at least in part be used to define lateral edges of wordlines (e.g., access or control-gate lines, and not shown in FIGS. 19 and 20) to be formed subsequently as described below.

Figure 21:
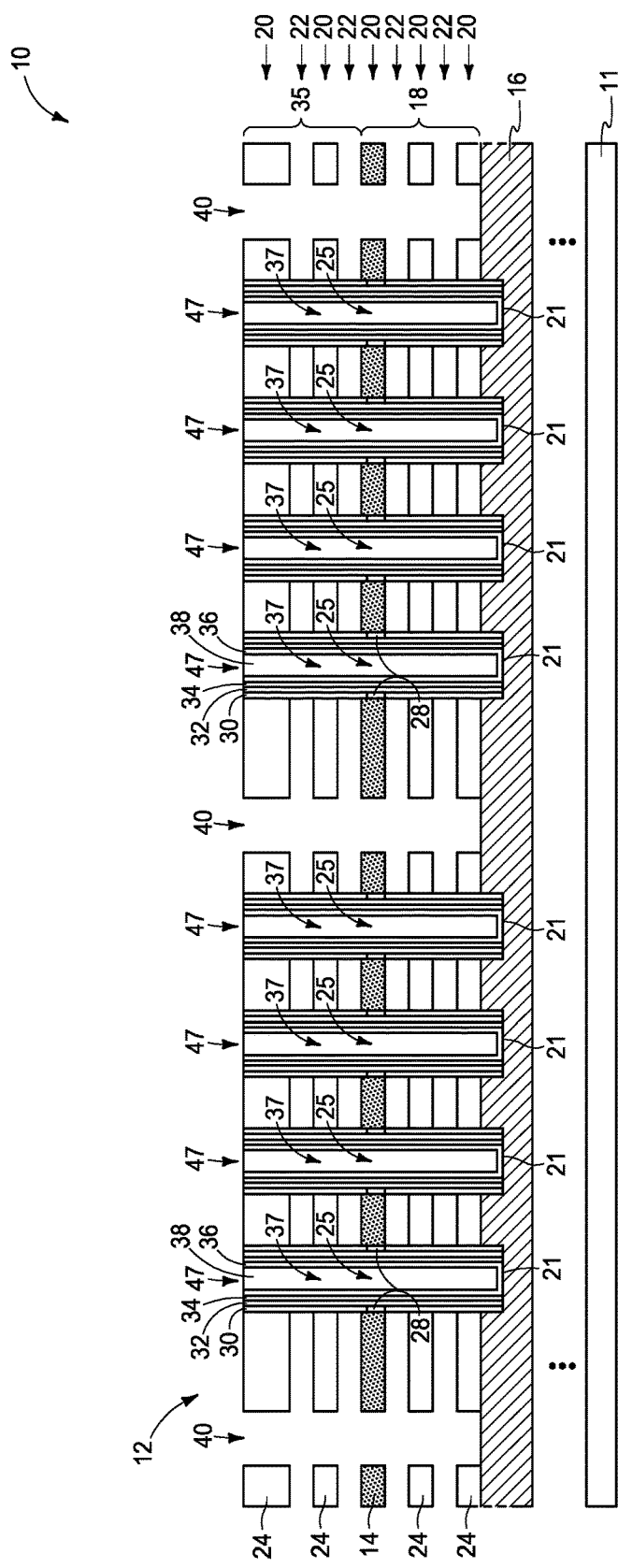
FIG. 21 is a view of the FIG. 20 substrate at a processing step subsequent to that shown by FIG. 20.

Referring to FIG. 21, upper-stack second material 26 (not shown) and lower-stack second material 26 (not shown) of wordline tiers 22 have been etched selectively relative to insulative upper-stack first material 24 and selectively relative to insulative lower-stack first material 24 (and in one embodiment selectively relative to seed material 14). An example etching chemistry, where second material 26 comprises silicon nitride, first material 24 comprises silicon dioxide, and seed material 14 comprises polysilicon, is liquid or vapor etching with $H_3PO_4$ as a primary etchant.

Figure 22:
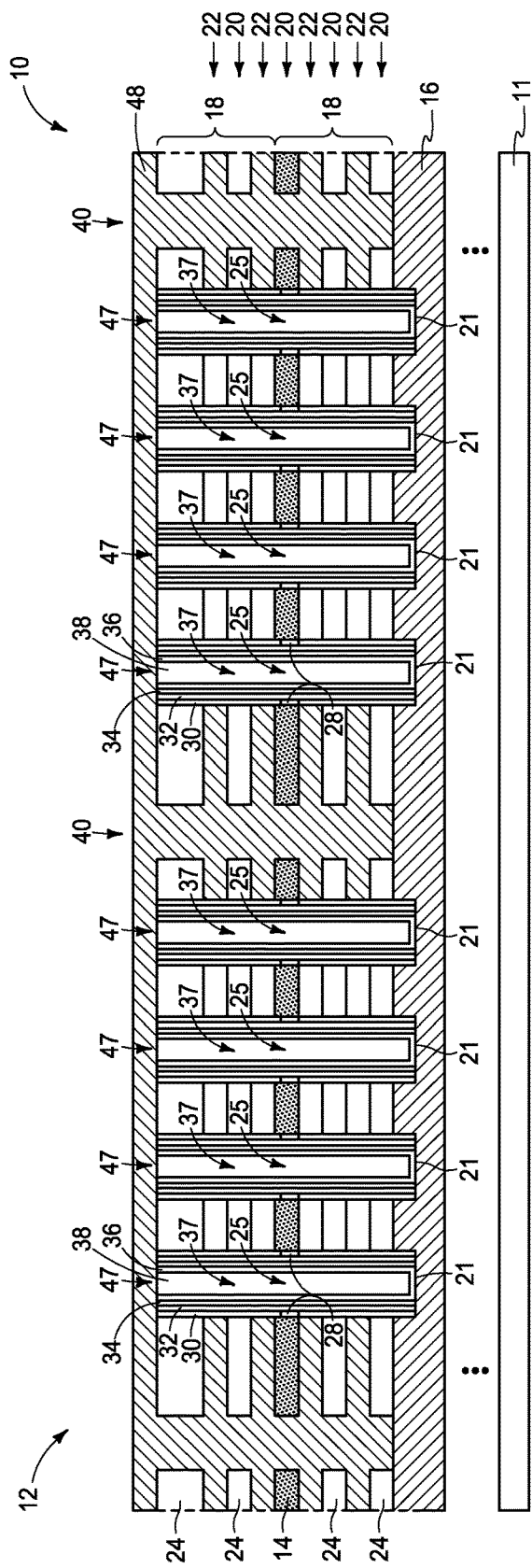
FIG. 22 is a view of the FIG. 21 substrate at a processing step subsequent to that shown by FIG. 21.

Referring to FIG. 22, control-gate material 48 (i.e., conductive material) has been formed into wordline tiers 22 through trenches 40 to be elevationally between insulative upper-stack first material 24 of upper-stack alternating tiers 20 and to be elevationally between insulative lower-stack first material 24 of lower-stack alternating tiers 20. Any suitable conductive material may be used, for example one or both of metal material and/or conductively-doped semiconductor material.

Figure 23:
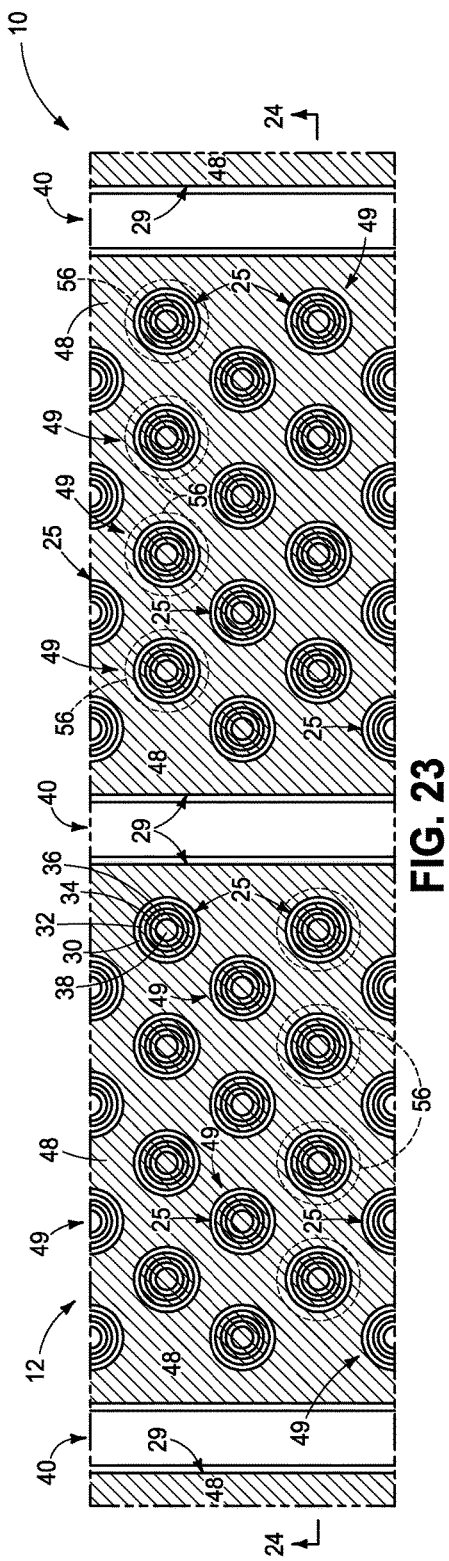
FIG. 23 is a view of the FIG. 22 substrate at a processing step subsequent to that shown by FIG. 22 and is taken through line 23-23 in FIG. 24.
Figure 24:
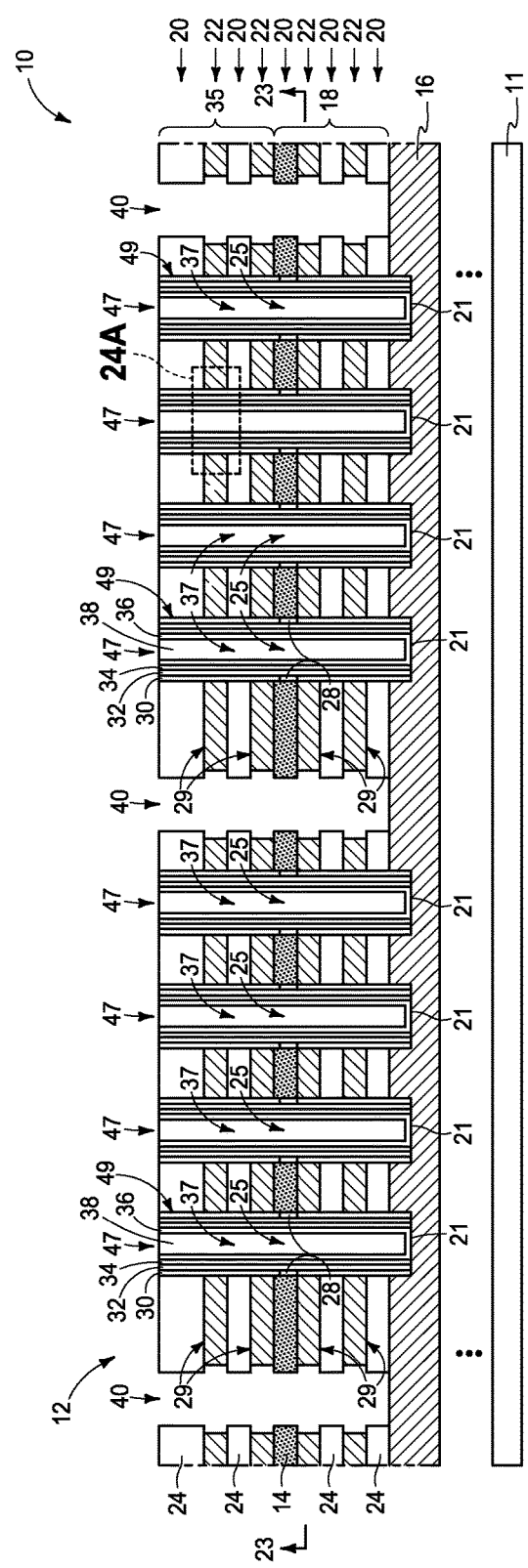
FIG. 24 is a view taken through line 24-24 in FIG. 23.
Figure 24A:
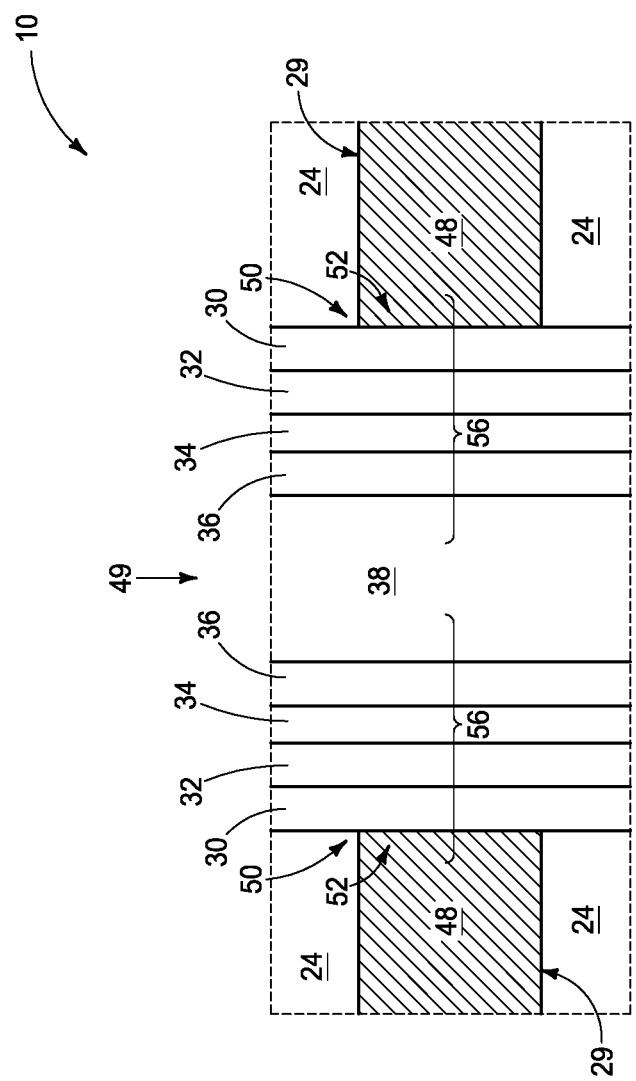
FIG. 24A is an enlarged view of a portion of the substrate as shown in FIG. 24.

Referring to FIGS. 23, 24, and 24a, control-gate material 48 has been removed from individual trenches 40. Such has resulted in formation of wordlines 29 and elevationally-extending strings 49 of individual transistors and/or memory cells 56. In one embodiment and as shown, strings 49 are formed to be vertical or within 10° of vertical. Approximate locations of transistors and/or memory cells 56 are indicated with brackets in FIG. 24A and some with dashed outlines in FIGS. 23 and 24, with transistors and/or memory cells 56 being essentially ring-like or annular in the depicted example. Control-gate material 48 has terminal ends 50 (FIG. 24A) corresponding to control-gate regions 52 of individual transistors and/or memory cells 56. Control-gate regions 52 in the depicted embodiment comprise individual portions of individual wordlines 29.

A charge-blocking region (e.g., charge-blocking material 30) is between charge-storage material 32 and individual control-gate regions 52. A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells. An example charge-blocking region as shown comprises insulator material 30. By way of further examples, a charge-blocking region may comprise a laterally (e.g., radially) outer portion of the charge-storage material (e.g., material 32) where such charge-storage material is insulative (e.g., in the absence of any different-composition material between an insulative charge-storage material 32 and conductive material 48). Regardless, as an additional example, an interface of a charge-storage material and conductive material of a control gate may be sufficient to function as a charge-blocking region in the absence of any separate-composition-insulator material 30. Further, an interface of conductive material 48 with material 30 (when present) in combination with insulator material 30 may together function as a charge-blocking region, and as alternately or additionally may a laterally-outer region of an insulative charge-storage material (e.g., a silicon nitride material 32).

Figure 25:
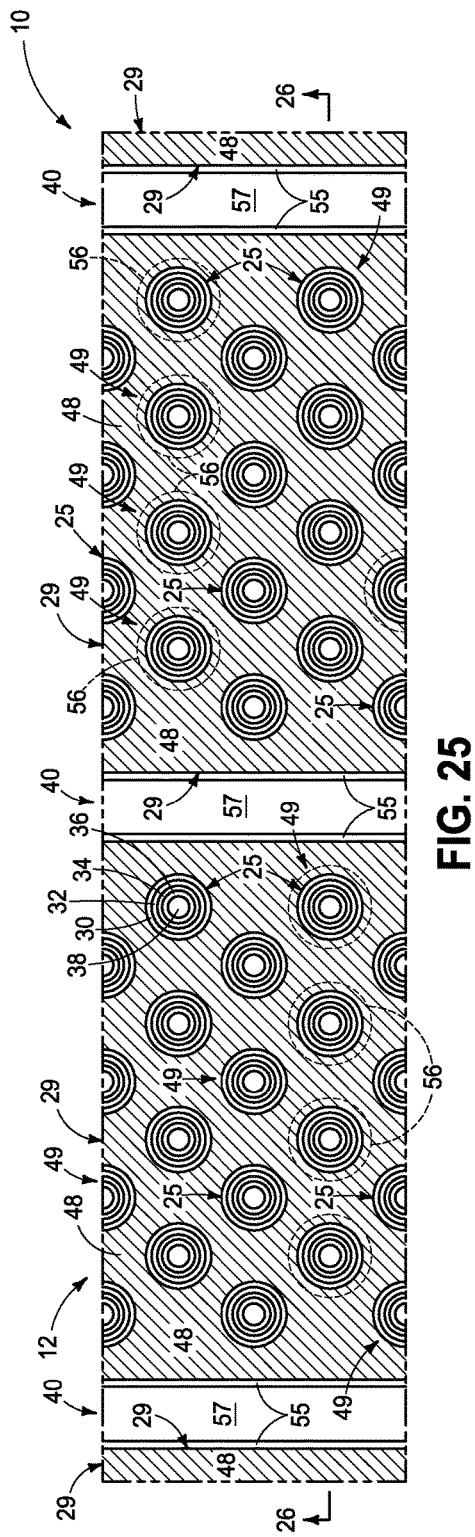
FIG. 25 is a view of the FIG. 23 substrate at a processing step subsequent to that shown by FIG. 23 and is taken through line 25-25 in FIG. 26.
Figure 26:
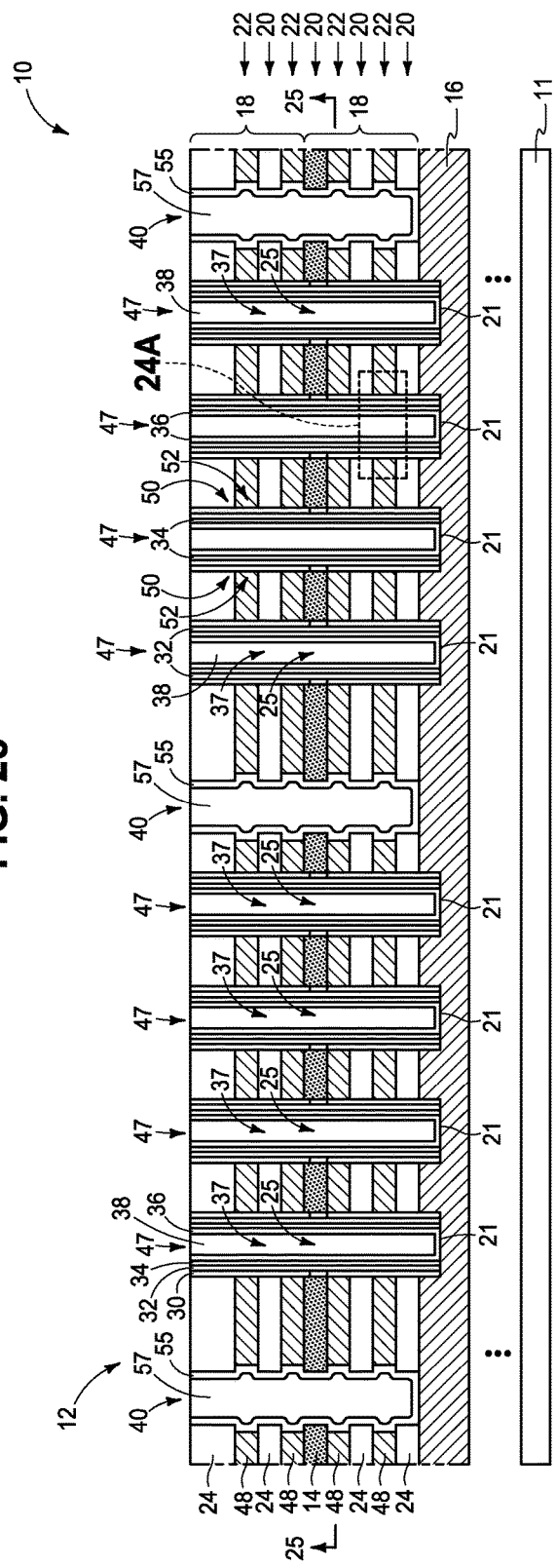
FIG. 26 is a view taken through line 26-26 in FIG. 25.

Referring to FIGS. 25 and 26, an insulative-material lining 55 has been formed in individual trenches 40 over and elevationally along sidewalls of such trenches (e.g., silicon nitride, silicon oxynitride, aluminum oxide, hafnium oxide, combinations of these, etc.). Another material 57 (dielectric and/or silicon-containing such as polysilicon) has been formed in individual trenches 40 elevationally along and spanning laterally between insulative-material lining 55. Any other attribute(s) or aspect(s) as shown and/or described herein with respect to other embodiments may be used.

The above-described embodiments show in the drawings formation of a seed material 14 that is of different composition from either of materials 24 and 26. An alternate example embodiment is shown and described with respect to a substrate construction 10a with respect to FIGS. 27-32. Like numerals from the above-described embodiments have been used where appropriate, with some construction differences being indicated with the suffix "a".

Figure 27:
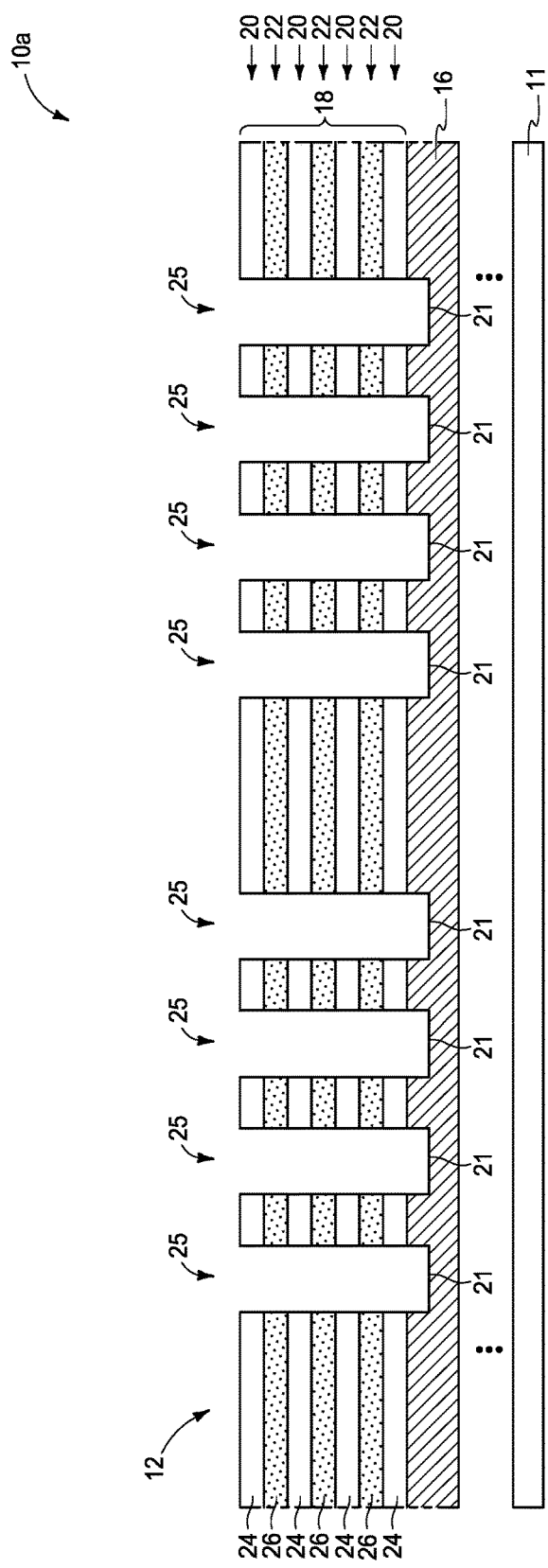
FIG. 27 is a diagrammatic cross-sectional view of a portion of a substrate in process in accordance with an embodiment of the invention.
Figure 28:
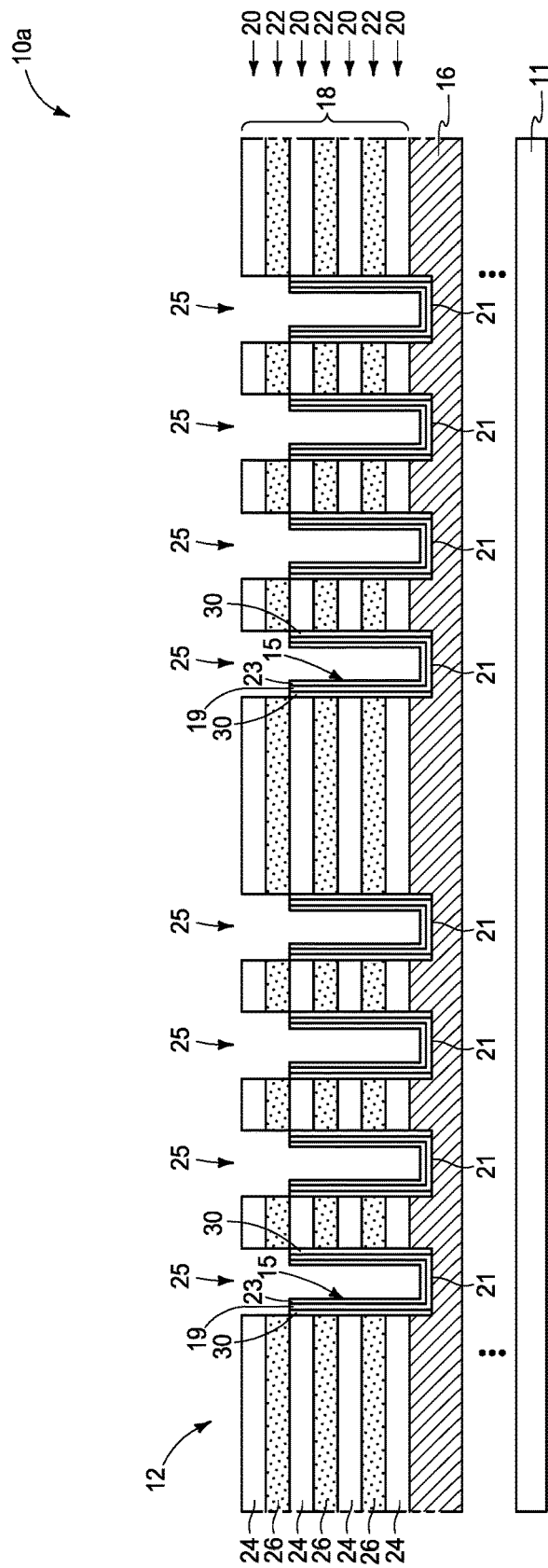
FIG. 28 is a view of the FIG. 27 substrate at a processing step subsequent to that shown by FIG. 27.
Figure 29:
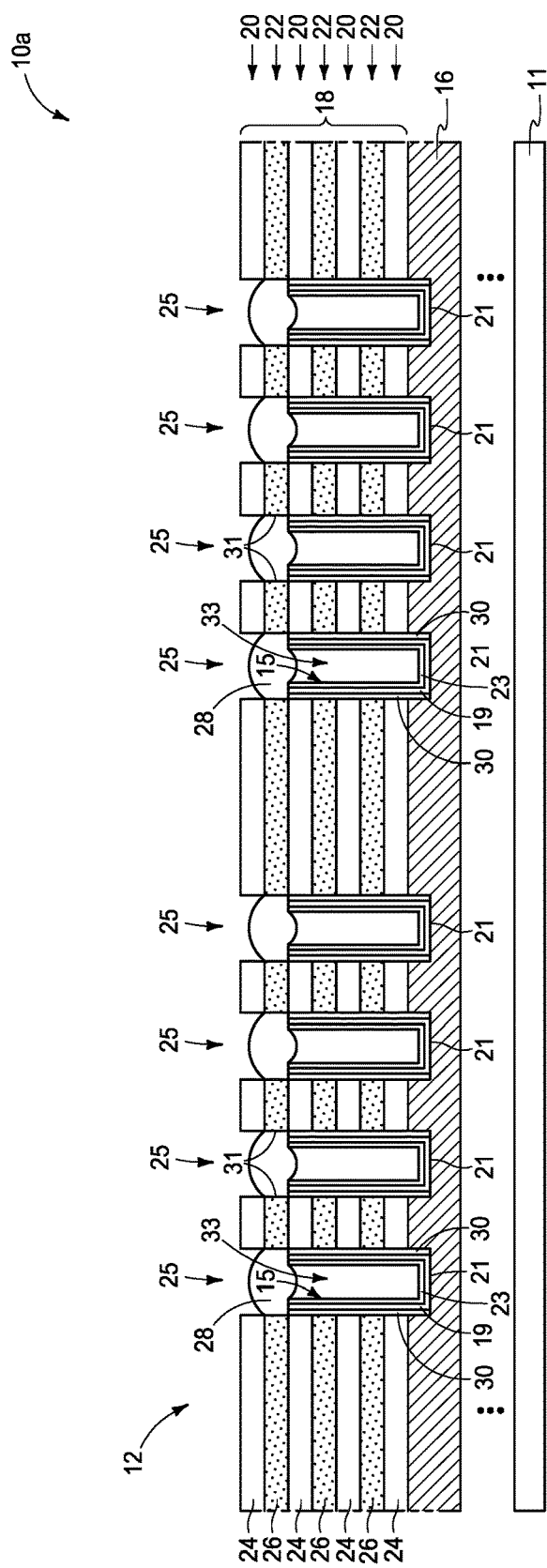
FIG. 29 is a view of the FIG. 28 substrate at a processing step subsequent to that shown by FIG. 28.
Figure 30:
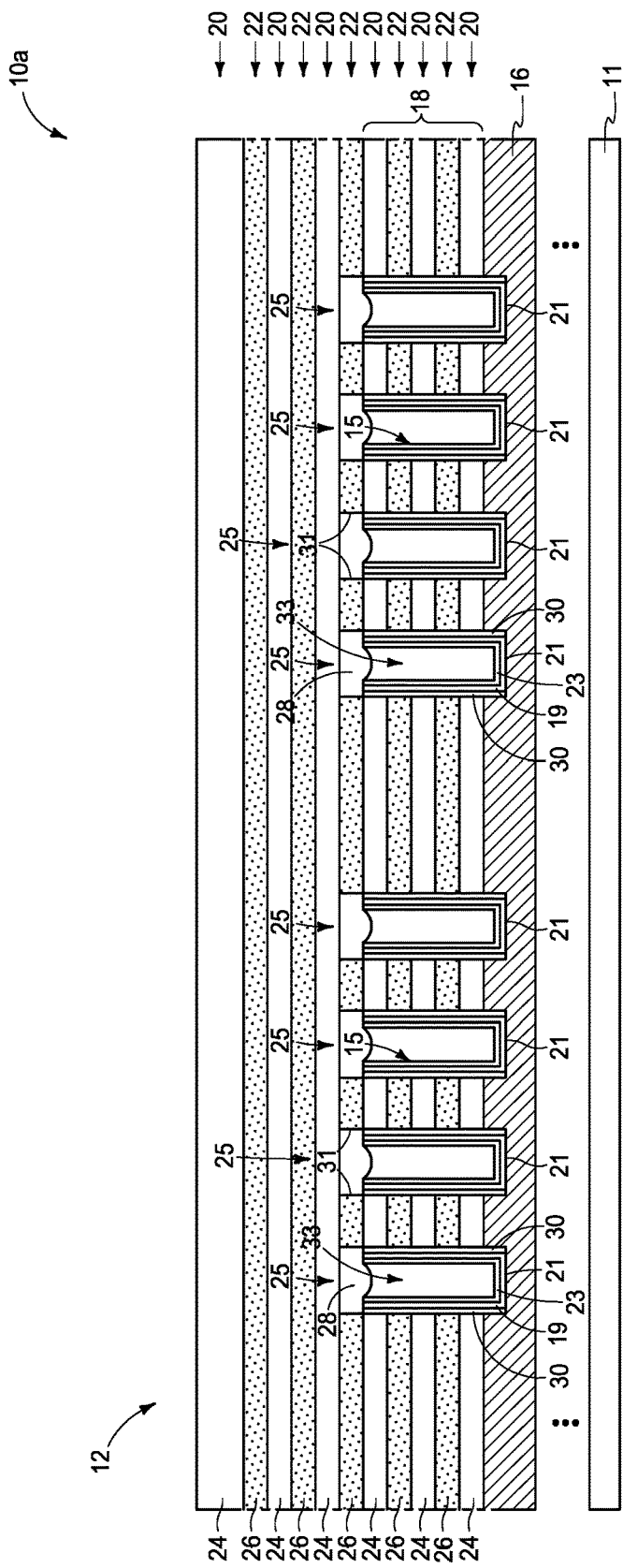
FIG. 30 is a view of the FIG. 29 substrate at a processing step subsequent to that shown by FIG. 29.
Figure 31:
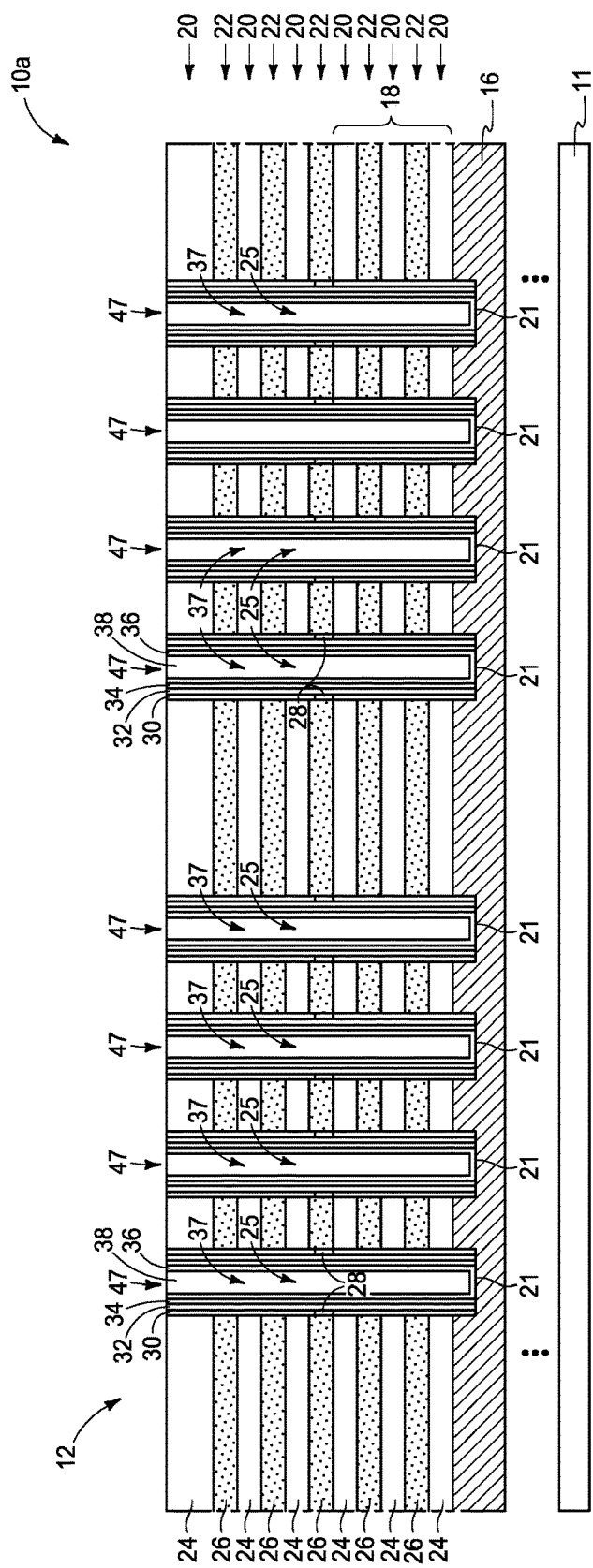
FIG. 31 is a view of the FIG. 30 substrate at a processing step subsequent to that shown by FIG. 30.
Figure 32:
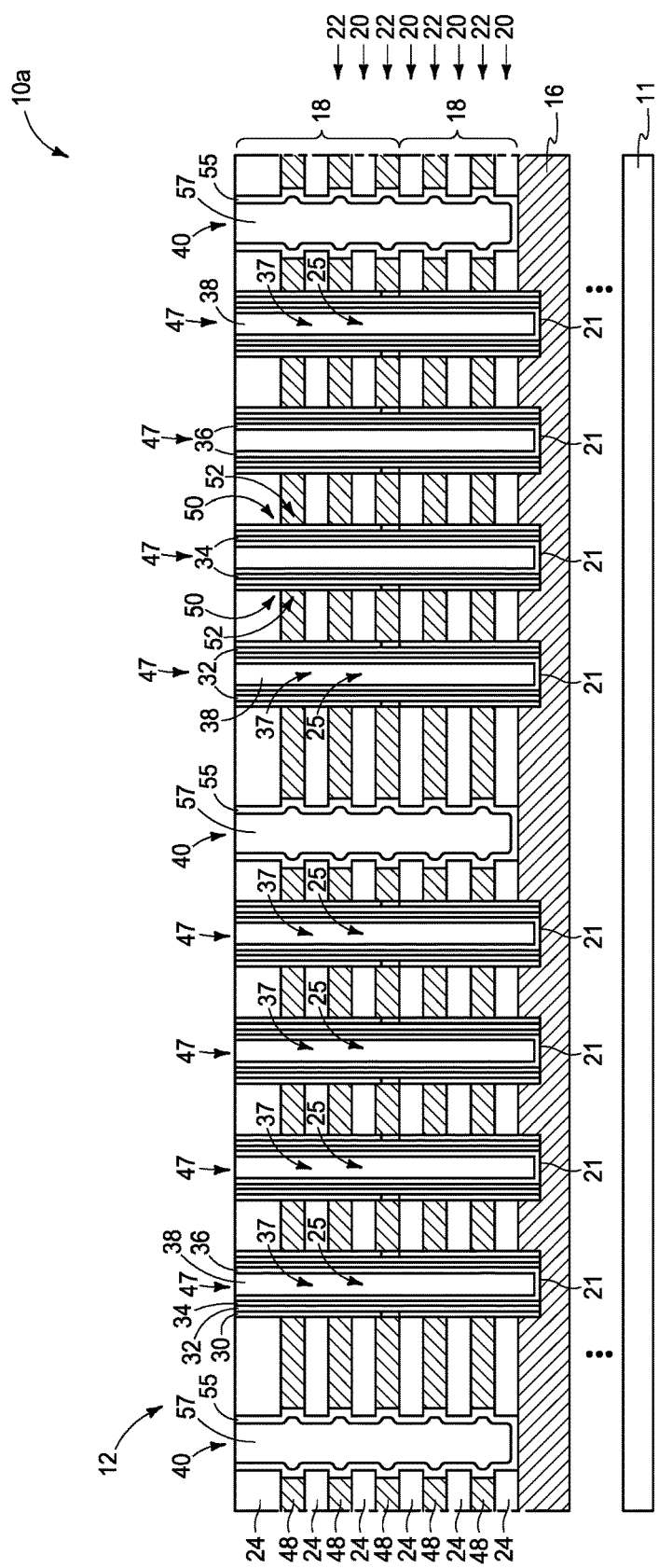
FIG. 32 is a view of the FIG. 31 substrate at a processing step subsequent to that shown by FIG. 31.

FIG. 27 shows an uppermost example wordline tier 22 as comprising, for example, silicon nitride which may be used as a seed material for epitaxially growing, for example, SiGe, elemental-form Si, and other materials. FIGS. 28 and 29 show example subsequent processing analogous to that occurring from FIGS. 3 through 9 of the first-described embodiments. FIG. 30 shows subsequent processing analogous to that occurring from FIGS. 10 through 11 wherein upper stack 35 is formed. FIGS. 31 and 32 show shows subsequent processing analogous to that occurring from FIGS. 12 through 26. Any other attribute(s) or aspect(s) as shown and/or described herein with respect to other embodiments may be used.

Alternately, and by way of example only, where the seed material comprises conductively-doped polysilicon that remains as part of the finished circuitry construction, such can be fabricated to comprise an operative gate to facilitate conduction through the channel material between the upper and lower stacks. For example, that polysilicon could be laterally recessed from the channel openings before or after forming the upper stack and before or after penetrating through the bridge to ultimately function as control-gate material. After penetrating through the epitaxially-grown bridge, then charge-blocking material and charge-storage material could be deposited in the lateral recesses and then removed from the channel openings. Charge-passage material and channel material could then be deposited in conjunction with depositing the same for the upper and lower stacks. That operative polysilicon gate can then be turned "on" to facilitate conduction through the channel material between channel material of the upper stack there-above and channel material of the lower stack there-below. Alternately if desired, conductive plugging material may be provided in the interconnected channel openings between the upper and lower stack channel material to improve conduction through the channel material between the upper and lower stacks. Any other attribute(s) or aspect(s) as shown and/or described herein with respect to other embodiments may be used.

The above processing as shown in the figures may be considered as so-called "gate-last" or "replacement-gate" processing (e.g., wherein the control-gate material is provided after forming the transistor channel material). Alternately, by way of example, so-called "gate first" processing may be used (e.g., wherein the control-gate material is provided before forming the transistor channel material). For example, the FIGS. 2 and 11 stacks could be fabricated initially with control-gate material 48 (not shown) in place of material 26. Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Herein, "selective" as to etch, etching, removing, removal, forming, and/or formation is such an act of one stated material relative to another stated material(s) so acted upon at a rate of at least 2:1 by volume.

Unless otherwise indicated, use of "or" herein encompasses either and both.

CONCLUSION

In some embodiments, a method used in forming an array of elevationally-extending strings of memory cells comprises forming a lower stack comprising vertically-alternating insulative tiers and wordline tiers. Lower channel openings are in the lower stack. A bridge is epitaxially grown that covers individual of the lower channel openings. A lower void space is beneath individual of the bridges in the individual lower channel openings. An upper stack is formed above the lower stack. The upper stack comprises vertically-alternating insulative tiers and wordline tiers. Upper channel openings are formed into the upper stack to the individual bridges to form interconnected channel openings individually comprising one of the individual lower channel openings and individual of the upper channel openings. The interconnected channel openings individually have one of the individual bridges there-across. The individual bridges are penetrated through to uncover individual of the lower void spaces. Transistor channel material is formed in an upper portion of the interconnected channel openings elevationally along the vertically-alternating tiers in the upper stack.

In some embodiments, a method used in forming an array of elevationally-extending strings of memory cells comprises forming a lower stack comprising vertically-alternating insulative tiers and wordline tiers. Lower channel openings are in the lower stack. Lower-stack memory cell material is laterally across a base and along sidewalls of individual of the lower channel openings. A portion of the lower-stack memory cell material that is laterally across individual of the bases in the individual lower channel openings is removed. A bridge is epitaxially grown and that covers individual of the lower channel openings. A lower void space is beneath individual of the bridges in the individual lower channel openings. An upper stack is formed above the lower stack. The upper stack comprises vertically-alternating insulative tiers and wordline tiers. Upper channel openings are formed into the upper stack to the individual bridges to form interconnected channel openings individually comprising one of the individual lower channel openings and individual of the upper channel openings. The interconnected channel openings individually have one of the individual bridges there-across. Upper-stack memory cell material is formed laterally across a base and along sidewalls of individual of the upper channel openings. A portion of the upper-stack memory cell material that is laterally across individual of the bases in the individual upper channel openings is removed. The individual bridges are penetrated through to uncover individual of the lower void spaces. Transistor channel material is formed in an upper portion of the interconnected channel openings elevationally along the vertically-alternating tiers in the upper stack.

In some embodiments, a method of forming an array of vertical strings of memory cells comprises forming a lower stack comprising vertically-alternating insulative tiers and wordline tiers. Lower channel openings are in the lower stack. A bridge is epitaxially grown and that covers individual of the lower channel openings. A lower void space is beneath individual of the bridges in the individual lower channel openings. An upper stack is formed above the lower stack. The upper stack comprises vertically-alternating insulative tiers and wordline tiers. Upper channel openings are formed into the upper stack to the individual bridges to form interconnected channel openings individually comprising one of the individual lower channel openings and individual of the upper channel openings. The interconnected channel openings individually have one of the individual bridges there-across. The individual bridges are penetrated through to uncover individual of the lower void spaces. Transistor channel material is formed in individual of the interconnected channel openings vertically along the vertically-alternating tiers in the upper and lower stacks. The wordline tiers are formed to comprise control-gate material having terminal ends corresponding to control-gate regions of individual memory cells. Charge-storage material is between the transistor channel material and the control-gate regions. Insulative charge-passage material is between the transistor channel material and the charge-storage material. A charge-blocking region is between the charge-storage material and individual of the control-gate regions.

In some embodiments, a method of forming an array of elevationally-extending strings of memory cells comprises forming a lower stack comprising vertically-alternating insulative tiers and wordline tiers, the lower-stack insulative tiers comprising insulative lower-stack first material. The lower-stack wordline tiers comprise lower-stack second material that is of different composition from that of the lower-stack first material. Lower channel openings are in the lower stack. Formed is at least one of (a): lower-stack charge-blocking material in individual of the lower channel openings and laterally across a base of the individual lower channel openings, or (b): lower-stack charge-storage material in the individual lower channel openings and laterally across the base of the individual lower channel openings. A portion of the at least one of (a) and (b) that is laterally across individual of the bases in the individual lower channel openings is removed. A bridge is epitaxially grown and that covers the individual lower channel openings. A lower void space is beneath individual of the bridges in the individual lower channel openings. An upper stack is formed above the lower stack. The upper stack comprises vertically-alternating insulative tiers and wordline tiers. The upper-stack insulative tiers comprise insulative upper-stack first material. The upper-stack wordline tiers comprise upper-stack second material that is of different composition from that of the upper-stack first material. Upper channel openings are formed into the upper stack to the individual bridges to form interconnected channel openings individually comprising one of the individual lower channel openings and individual of the upper channel openings. The interconnected channel openings individually have one of the individual bridges there-across. Formed is at least one of (c): upper-stack charge-blocking material in individual of the upper channel openings and laterally across a base of the individual upper channel openings, or (d): upper-stack charge-storage material in the individual upper channel openings and laterally across the base of the individual upper channel openings. A portion of the at least one of (c) and (d) that is laterally across individual of the bases in the individual upper channel openings is removed. The individual bridges are penetrated through to uncover individual of the lower void spaces. Transistor channel material is formed in an upper portion of the interconnected channel openings elevationally along the vertically-alternating tiers in the upper stack. Horizontally-elongated trenches are formed into the upper and lower stacks. The upper-stack second material and the lower-stack second material of the wordline tiers is etched selectively relative to the insulative upper-stack first material and to the insulative lower-stack first material. Control-gate material is formed into the wordline tiers through the trenches to be elevationally between the insulative upper-stack first material of the upper-stack alternating tiers and to be elevationally between the insulative lower-stack first material of the lower-stack alternating tiers. The control-gate material has terminal ends corresponding to control-gate regions of individual memory cells. The control-gate material is removed from the individual trenches. The wordline tiers are formed to comprise the charge-storage material between the transistor channel material and the control-gate regions, insulative charge-passage material between the transistor channel material and the charge-storage material, and a charge-blocking region between the charge-storage material and individual of the control-gate regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming an array of elevationally-extending strings of memory cells, comprising:
    forming a lower stack comprising vertically-alternating insulative tiers and wordline tiers, lower channel openings being in the lower stack;
    epitaxially growing a bridge that covers individual of the lower channel openings, a lower void space being beneath individual of the bridges in the individual lower channel openings;
    forming an upper stack above the lower stack, the upper stack comprising vertically-alternating insulative tiers and wordline tiers;
    forming upper channel openings into the upper stack to the individual bridges to form interconnected channel openings individually comprising one of the individual lower channel openings and individual of the upper channel openings, the interconnected channel openings individually having one of the individual bridges thereacross;
    penetrating through the individual bridges to uncover individual of the lower void spaces; and
    forming transistor channel material in an upper portion of the interconnected channel openings elevationally along the vertically-alternating tiers in the upper stack.

2. The method of claim 1 wherein the bridge comprises elemental-form silicon.

3. The method of claim 1 wherein the bridge comprises SiGe.

4. The method of claim 1 wherein the epitaxial growing comprises heteroepitaxy.

5. The method of claim 1 wherein the epitaxial growing is conducted selectively from a sidewall surface of a seed material that surrounds the individual lower channel openings.

6. The method of claim 5 comprising masking material atop the seed material during the epitaxial growing, and further comprising removing all of the masking material before forming the upper stack.

7. The method of claim 5 comprising masking material atop the seed material during the epitaxial growing, and further comprising forming the upper stack atop the masking material.

8. The method of claim 1 wherein the epitaxial growing is conducted from a sidewall surface and from a top surface of a seed material that surrounds the individual lower channel openings.

9. The method of claim 1 wherein the epitaxial growing is conducted from a sidewall surface of a seed material that surrounds the individual lower channel openings, sidewalls of the individual lower channel openings being masked below the seed material during the epitaxial growing.

10. The method of claim 9 wherein the sidewalls of the individual lower channel openings below the seed material are masked with mask material during the epitaxial growing, and further comprising:
    forming the mask material all over the sidewall surface of the seed material within the individual lower channel openings; and
    elevationally recessing the mask material to below a top surface of the seed material prior to the epitaxial growing.

11. The method of claim 10 wherein the elevationally recessing is downward at least to a bottom surface of the seed material.

12. The method of claim 1 wherein the forming of the transistor channel material forms the transistor channel material concurrently in both the upper and lower channel openings of the interconnected channel openings.

13. A method used in forming an array of elevationally-extending strings of memory cells, comprising:
    forming a lower stack comprising vertically-alternating insulative tiers and wordline tiers, lower channel openings being in the lower stack, lower-stack memory cell material being laterally across a base and along sidewalls of individual of the lower channel openings;
    removing a portion of the lower-stack memory cell material that is laterally across individual of the bases in the individual lower channel openings;
    epitaxially growing a bridge that covers individual of the lower channel openings, a lower void space being beneath individual of the bridges in the individual lower channel openings;
    forming an upper stack above the lower stack, the upper stack comprising vertically-alternating insulative tiers and wordline tiers;
    forming upper channel openings into the upper stack to the individual bridges to form interconnected channel openings individually comprising one of the individual lower channel openings and individual of the upper channel openings, the interconnected channel openings individually having one of the individual bridges thereacross;
    forming upper-stack memory cell material laterally across a base and along sidewalls of individual of the upper channel openings;
    removing a portion of the upper-stack memory cell material that is laterally across individual of the bases in the individual upper channel openings;
    penetrating through the individual bridges to uncover individual of the lower void spaces; and
    forming transistor channel material in an upper portion of the interconnected channel openings elevationally along the vertically-alternating tiers in the upper stack.

14. The method of claim 13 wherein the epitaxial growing is conducted from a sidewall surface of a seed material that surrounds the individual lower channel openings, and further comprising elevationally recessing the lower-stack memory cell material to below a top surface of the seed material prior to the epitaxial growing.

15. The method of claim 13 comprising forming a sacrificial liner along sidewalls and the individual bases of the individual lower channel openings after removing the portion of the lower-stack memory cell material and before the epitaxially growing.

16. The method of claim 15 comprising removing all of the sacrificial liner after the penetrating through.

17. The method of claim 15 wherein the sacrificial liner less-than-fills the individual lower channel openings, and further comprising plugging all remaining volume of the individual lower channel openings with sacrificial fill material after forming the sacrificial liner.

18. The method of claim 17 wherein the sacrificial liner comprises polysilicon.

19. The method of claim 18 wherein the sacrificial liner comprises silicon dioxide radially inward of the polysilicon.

20. The method of claim 17 wherein the epitaxial growing is conducted from a sidewall surface of a seed material that surrounds the individual lower channel openings, and further comprising elevationally recessing the sacrificial liner and the sacrificial fill material to below a top surface of the seed material prior to the epitaxial growing.

21. The method of claim 20 comprising elevationally recessing the sacrificial fill material before elevationally recessing the sacrificial liner.

22. The method of claim 20 wherein the sacrificial fill material is recessed elevationally inward to a bottom surface of the seed material.

23. The method of claim 13 comprising forming a sacrificial liner along sidewalls and the individual bases of the individual upper channel openings after removing the portion of the upper-stack memory cell material and before the penetrating.

24. A method of forming an array of vertical strings of memory cells, comprising:
forming a lower stack comprising vertically-alternating insulative tiers and wordline tiers, lower channel openings being in the lower stack;
epitaxially growing a bridge that covers individual of the lower channel openings, a lower void space being beneath individual of the bridges in the individual lower channel openings;
forming an upper stack above the lower stack, the upper stack comprising vertically-alternating insulative tiers and wordline tiers;
forming upper channel openings into the upper stack to the individual bridges to form interconnected channel openings individually comprising one of the individual lower channel openings and individual of the upper channel openings, the interconnected channel openings individually having one of the individual bridges thereacross;
penetrating through the individual bridges to uncover individual of the lower void spaces;
forming transistor channel material in individual of the interconnected channel openings vertically along the vertically-alternating tiers in the upper and lower stacks; and
forming the wordline tiers to comprise control-gate material having terminal ends corresponding to control-gate regions of individual memory cells, charge-storage material between the transistor channel material and the control-gate regions, insulative charge-passage material between the transistor channel material and the charge-storage material, and a charge-blocking region between the charge-storage material and individual of the control-gate regions.

25. The method of claim 24 wherein the forming of the wordline tiers to comprise control-gate material occurs after forming the transistor channel material.

26. The method of claim 24 wherein the forming of the wordline tiers to comprise control-gate material occurs before forming the transistor channel material.

27. A method of forming an array of elevationally-extending strings of memory cells, comprising:
forming a lower stack comprising vertically-alternating insulative tiers and wordline tiers, the lower-stack insulative tiers comprising insulative lower-stack first material, the lower-stack wordline tiers comprising lower-stack second material that is of different composition from that of the lower-stack first material, lower channel openings being in the lower stack;
forming at least one of (a): lower-stack charge-blocking material in individual of the lower channel openings and laterally across a base of the individual lower channel openings, or (b): lower-stack charge-storage material in the individual lower channel openings and laterally across the base of the individual lower channel openings;
removing a portion of the at least one of (a) and (b) that is laterally across individual of the bases in the individual lower channel openings;
epitaxially growing a bridge that covers the individual lower channel openings, a lower void space being beneath individual of the bridges in the individual lower channel openings;
forming an upper stack above the lower stack, the upper stack comprising vertically-alternating insulative tiers and wordline tiers, the upper-stack insulative tiers comprising insulative upper-stack first material, the upper-stack wordline tiers comprising upper-stack second material that is of different composition from that of the upper-stack first material;
forming upper channel openings into the upper stack to the individual bridges to form interconnected channel openings individually comprising one of the individual lower channel openings and individual of the upper channel openings, the interconnected channel openings individually having one of the individual bridges thereacross;
forming at least one of (c): upper-stack charge-blocking material in individual of the upper channel openings and laterally across a base of the individual upper channel openings, or (d): upper-stack charge-storage material in the individual upper channel openings and laterally across the base of the individual upper channel openings;
removing a portion of the at least one of (c) and (d) that is laterally across individual of the bases in the individual upper channel openings;
penetrating through the individual bridges to uncover individual of the lower void spaces;
forming transistor channel material in an upper portion of the interconnected channel openings elevationally along the vertically-alternating tiers in the upper stack;
forming horizontally-elongated trenches into the upper and lower stacks;
etching the upper-stack second material and the lower-stack second material of the wordline tiers selectively relative to the insulative upper-stack first material and to the insulative lower-stack first material;
forming control-gate material into the wordline tiers through the trenches to be elevationally between the insulative upper-stack first material of the upper-stack alternating tiers and to be elevationally between the insulative lower-stack first material of the lower-stack alternating tiers, the control-gate material having terminal ends corresponding to control-gate regions of individual memory cells;

removing the control-gate material from the individual trenches; and forming the wordline tiers to comprise the charge-storage material between the transistor channel material and the control-gate regions, insulative charge-passage material between the transistor channel material and the charge-storage material, and a charge-blocking region between the charge-storage material and individual of the control-gate regions.

* * * * *